(12) United States Patent
Guo et al.

(10) Patent No.: US 11,972,806 B2
(45) Date of Patent: Apr. 30, 2024

(54) READ TECHNIQUES TO REDUCE READ ERRORS IN A MEMORY DEVICE

(71) Applicant: SanDisk Technologies LLC, Addison, TX (US)

(72) Inventors: Jiacen Guo, Cupertino, CA (US); Xiang Yang, Santa Clara, CA (US)

(73) Assignee: SanDisk Technologies, LLC, Addison, TX (US)

( * ) Notice: Subject to any disclaimer, the term of this patent is extended or adjusted under 35 U.S.C. 154(b) by 181 days.

(21) Appl. No.: 17/837,744

(22) Filed: Jun. 10, 2022

(65) Prior Publication Data
US 2023/0402105 A1     Dec. 14, 2023

(51) Int. Cl.
| | |
|---|---|
| *G11C 16/26* | (2006.01) |
| *G11C 11/56* | (2006.01) |
| *G11C 16/04* | (2006.01) |
| *G11C 16/08* | (2006.01) |

(52) U.S. Cl.
CPC .......... *G11C 16/26* (2013.01); *G11C 11/5642* (2013.01); *G11C 11/5671* (2013.01); *G11C 16/0483* (2013.01); *G11C 16/08* (2013.01)

(58) Field of Classification Search
CPC . G11C 16/26; G11C 11/5642; G11C 11/5671; G11C 16/0483; G11C 16/08; G11C 16/32; G11C 16/24; G11C 11/5628; G11C 16/10; G11C 16/3459

USPC ...................................................... 365/185.03
See application file for complete search history.

(56) References Cited

U.S. PATENT DOCUMENTS

| | | | |
|---|---|---|---|
| 7,551,477 B2 | 6/2009 | Mokhlesi et al. | |
| 10,460,808 B2 | 10/2019 | Lee et al. | |
| 11,205,480 B1 | 12/2021 | Giduturi | |
| 11,335,411 B1 * | 5/2022 | Lien ...................... | G11C 16/14 |
| 2019/0385680 A1 * | 12/2019 | Dunga ............... | G11C 16/0466 |
| 2020/0005871 A1 * | 1/2020 | Yang .................. | G11C 16/0483 |
| 2021/0233597 A1 * | 7/2021 | Yoon .................. | G11C 16/0483 |
| 2021/0272627 A1 | 9/2021 | Lee | |
| 2021/0398590 A1 | 12/2021 | Sancon | |

* cited by examiner

*Primary Examiner* — Huan Hoang
*Assistant Examiner* — Minh Dinh
(74) *Attorney, Agent, or Firm* — Dickinson Wright PLLC; Steven C. Hurles

(57) ABSTRACT

The memory device includes a memory block with a plurality of memory cells, which are programmed to multiple bits per memory cell, arranged in a plurality of word lines. Control circuitry is provided and is configured to read the memory cells of a selected word line. The control circuitry separates the memory cells of the selected word line into a first group of memory cells, which are located on a side of the word line are near a voltage driver, and a second group of memory cells, which are located on an opposite side of the word line from the voltage driver. The control circuitry reads the memory cells of the first group using a first read mode and reads the memory cells of the second group using a second read mode that is different than the first read mode to reduce a fail bit count during read.

20 Claims, 25 Drawing Sheets

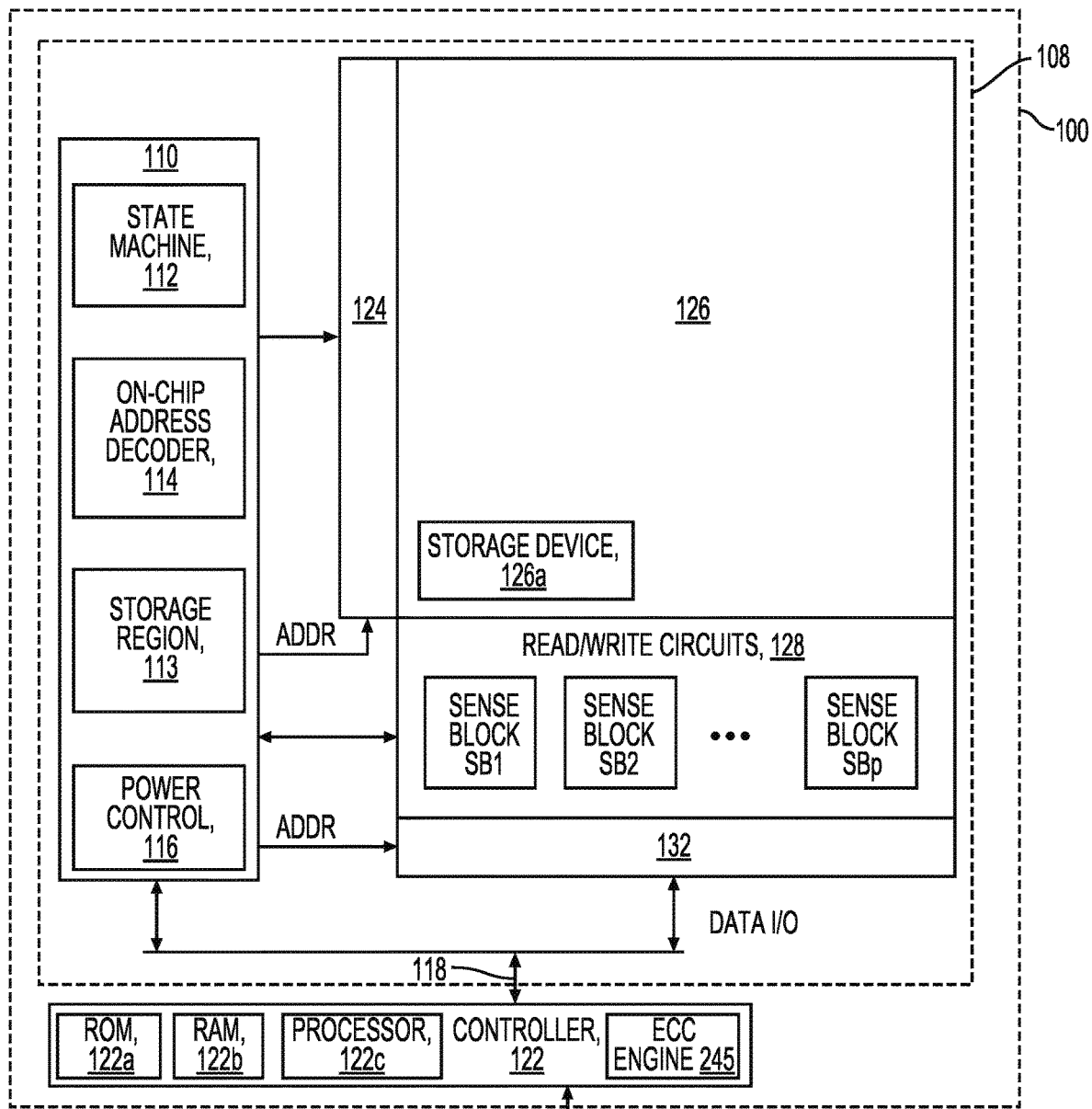
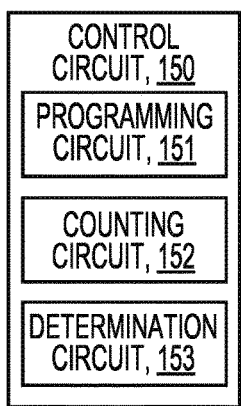
FIG. 1A
FIG. 1B

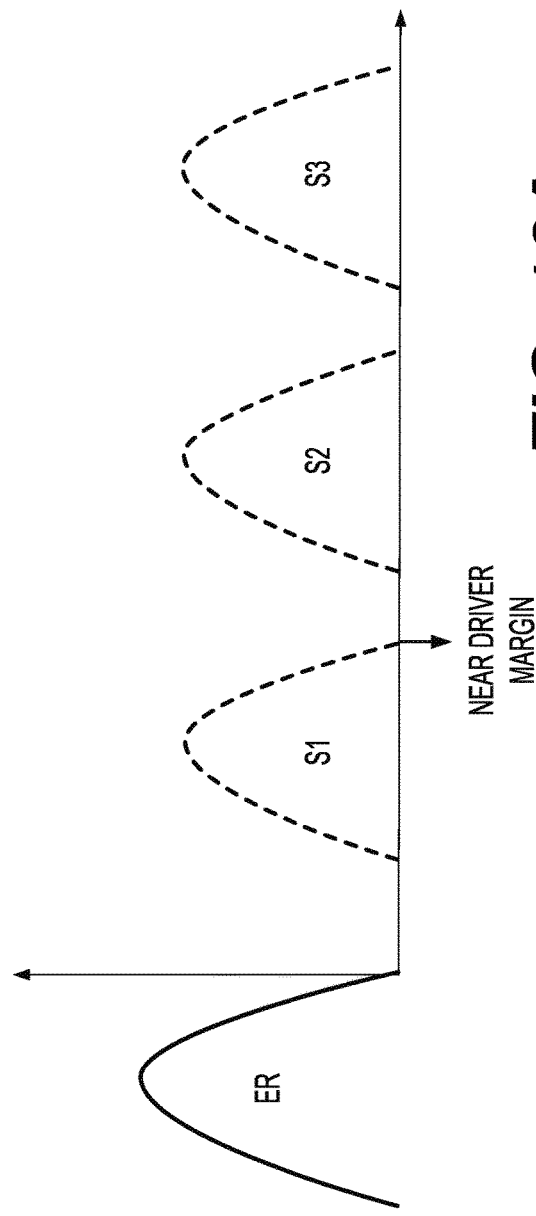
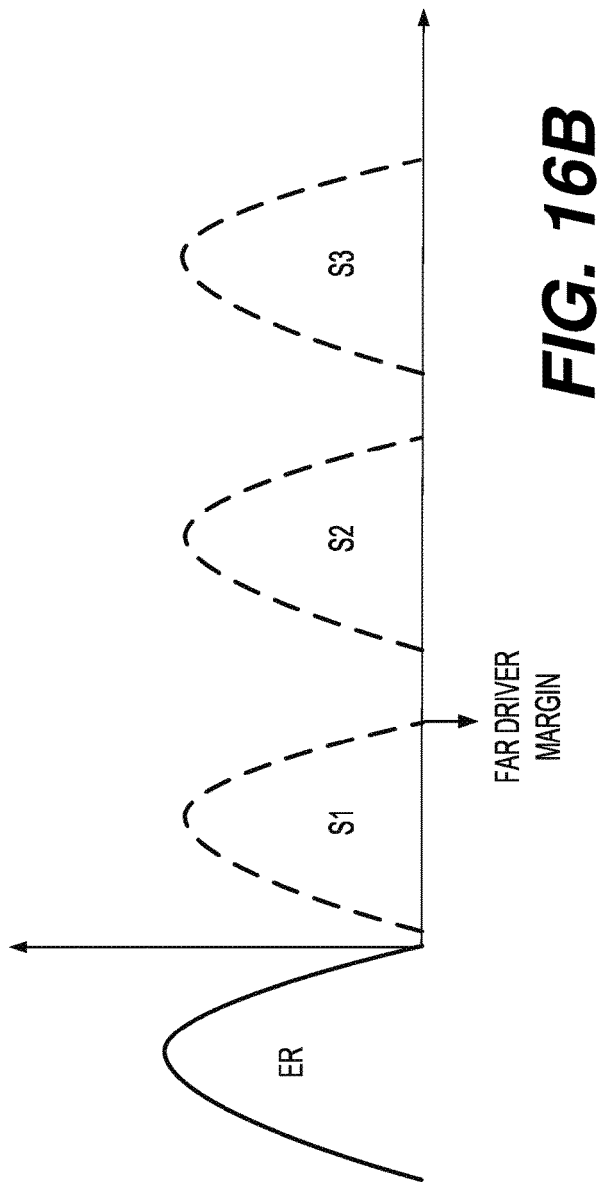

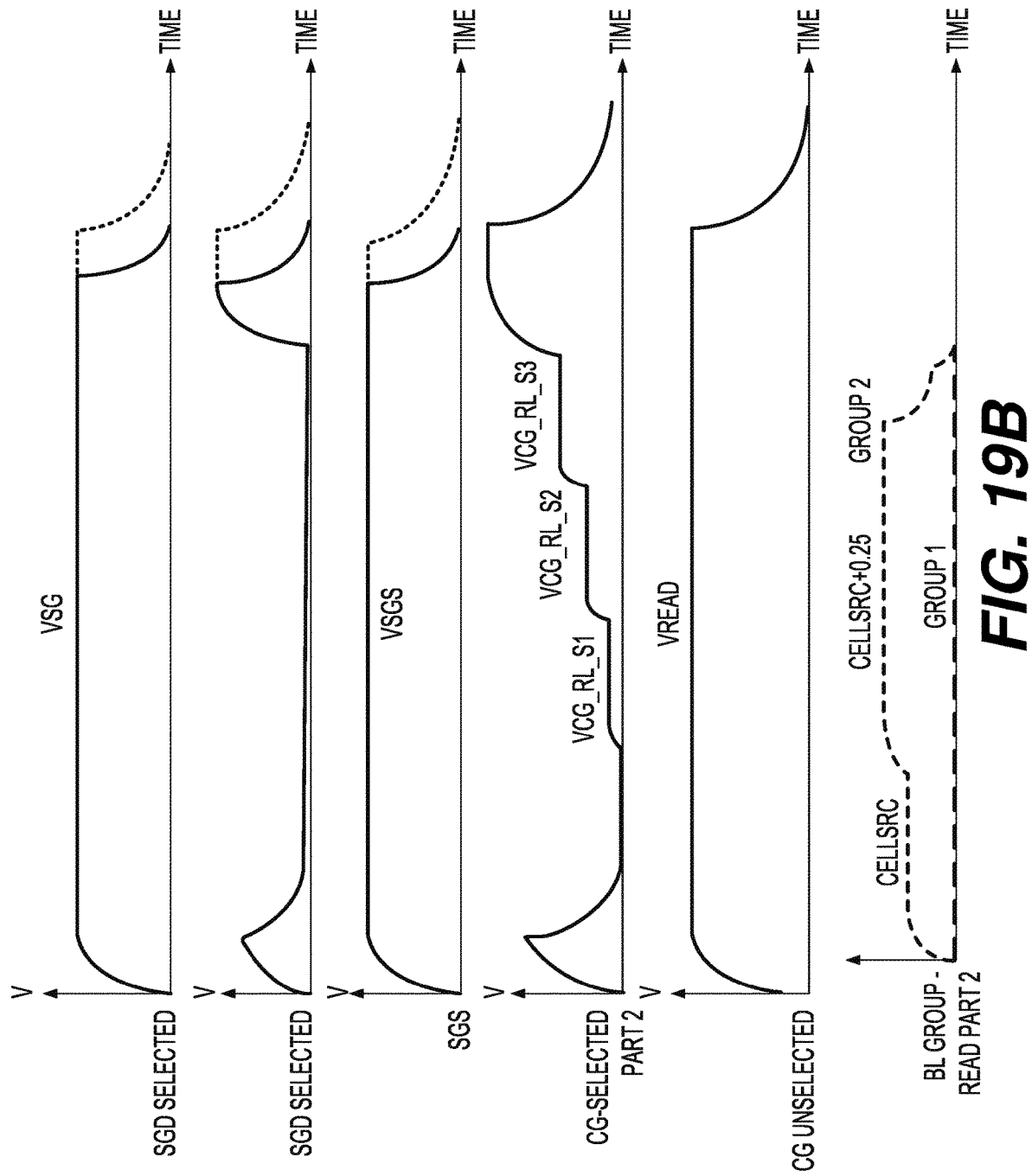

READ TECHNIQUES TO REDUCE READ ERRORS IN A MEMORY DEVICE

BACKGROUND

1. Field

The present disclosure is related generally to memory devices and more particularly to improved read techniques that reduce read errors.

2. Related Art

Semiconductor memory is widely used in various electronic devices, such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power, e.g., a battery.

Such non-volatile memory devices generally include a plurality of memory cells that are arranged in memory blocks, which each include a plurality of word lines. The memory cells are configured to be programmed to retain threshold voltages that are associated with programmed data states. After programming, the data contained in the memory cells can be accessed in a read operation whereby the threshold voltages of the memory cells are sensed. There remains a continuing need for improved read operations that are able to more accurately read the data that is programmed into the memory cells with fewer read errors.

SUMMARY

One aspect of the present disclosure is related to a method of reading memory cells in a memory device. The method includes the step of preparing a memory block that includes a plurality of memory cells arranged in a plurality of word lines. The memory cells are programmed to multiple bits per memory cell. The memory block includes a voltage driver that is located on one side of the word lines. The method proceeds with the step of separating the memory cells of a selected word line of the plurality of word lines into a first group of memory cells, which are located on a side of the word line are near the voltage driver, and a second group of memory cells, which are located on an opposite side of the word line from the voltage driver. The method continues with the steps of reading the memory cells of the first group of memory cells using a first read mode and reading the memory cells of the second group using a second read mode that is different than the first read mode to reduce a fail bit count.

According to another aspect of the present disclosure, in the selected word line, the first group of memory cells includes a plurality of first error correction code memory cells, and the second group of memory cells includes a plurality of second error correction code memory cells.

According to yet another aspect of the present disclosure, half of the memory cells of the selected word line are in the first group of memory cells, and half of the memory cells of the selected word line are in the second group of memory cells.

According to still another aspect of the present disclosure, the first read mode includes locking out the memory cells of the second group while the memory cells of the first group are read, and the second read mode includes locking out the memory cells of the first group while the memory cells of the second group are read.

According to a further aspect of the present disclosure, the first read mode includes applying a first set of read voltages to the selected word line, and the second read mode includes applying a second set of read voltages to the selected word line. The second set of read voltages is different than the first set of read voltages.

According to yet a further aspect of the present disclosure, the second set of read voltages are less than the first set of read voltages.

According to still a further aspect of the present disclosure, the first read mode includes sensing the memory cells of the first group using a first set of sense times, and the second read mode includes sensing the memory cells of the second group using a second set of sense times that is different than the first set of sense times.

According to another aspect of the present disclosure, the first read mode includes applying first non-zero bit line voltage to the bit lines coupled to the memory cells of the first group, and the second read mode includes applying a second non-zero bit line voltage to the bit lines coupled to the memory cells of the second group, the first non-zero bit line voltage being greater than the second non-zero bit line voltage such that effective threshold voltages of the memory cells of the first group are reduced through a drain-side induced barrier layer effect.

According to yet another aspect of the present disclosure, the memory cells of the selected word line are programmed to two bits per memory cell (MLC) in a programming operation that does not include verify.

Another aspect of the present disclosure is related to a memory device that includes a memory block with a plurality of memory cells arranged in a plurality of word lines. The memory cells are programmed to multiple bits per memory cell. The memory block also includes a voltage driver that is located on one side of the word lines. The memory device further includes control circuitry that is configured to read the memory cells of a selected word line of the plurality of word lines. The control circuitry is configured to separate the memory cells of the selected word line into a first group of memory cells, which are located on a side of the word line are near the voltage driver, and a second group of memory cells, which are located on an opposite side of the word line from the voltage driver. The control circuitry is also configured to read the memory cells of the first group of memory cells using a first read mode and read the memory cells of the second group using a second read mode that is different than the first read mode to reduce a fail bit count.

According to another aspect of the present disclosure, in the selected word line, the first group of memory cells includes a plurality of first error correction code memory cells, and the second group of memory cells includes a plurality of second error correction code memory cells.

According to yet another aspect of the present disclosure, half of the memory cells of the selected word line are in the first group of memory cells, half of the memory cells of the selected word line are in the second group of memory cells.

According to still another aspect of the present disclosure, the first read mode includes the control circuitry locking out the memory cells of the second group while the memory cells of the first group are read, and the second read mode includes the control circuitry locking out the memory cells of the first group while the memory cells of the second group are read.

According to a further aspect of the present disclosure, the first read mode includes the control circuitry applying a first set of read voltages to the selected word line, and the second read mode includes the control circuitry applying a second set of read voltages to the selected word line. The second set of read voltages is different than the first set of read voltages.

According to yet a further aspect of the present disclosure, the second set of read voltages are less than the first set of read voltages.

According to still a further aspect of the present disclosure, the first read mode includes the control circuitry sensing the memory cells of the first group using a first set of sense times, and the second read mode includes the control circuitry sensing the memory cells of the second group using a second set of sense times that is different than the first set of sense times.

According to another aspect of the present disclosure, the first read mode includes the control circuitry applying first non-zero bit line voltage to the bit lines coupled to the memory cells of the first group, and the second read mode includes the control circuitry applying a second non-zero bit line voltage to the bit lines coupled to the memory cells of the second group. The first non-zero bit line voltage is greater than the second non-zero bit line voltage such that effective threshold voltages of the memory cells of the first group are reduced through a drain-side induced barrier layer effect.

According to yet another aspect of the present disclosure, the memory cells of the selected word line are programmed to two bits per memory cell (MLC) in a programming operation that does not include verify.

Yet another aspect of the present disclosure is related to an apparatus that includes a memory block. The memory block includes a plurality of memory cells that are arranged in a plurality of word lines and that are programmed to multiple bits per memory cell. The memory block also includes a voltage driver that is located on one side of the word lines. The apparatus also includes a reading means for reading the memory cells of a selected word line of the plurality of word lines. The reading means is configured to separate the memory cells of the selected word line into a first group of memory cells and a second group of memory cells. The first group of memory cells includes the half the memory cells of the selected word line that are located on a side of the word line adjacent the voltage driver, and the second group of memory cells includes the half of the memory cells of the selected word line that are located on an opposite side of the word line from the voltage driver. The reading means is also configured to read the memory cells of the first group of memory cells using a first read mode and read the memory cells of the second group using a second read mode that is different than the first read mode to reduce a fail bit count.

According to another aspect of the present disclosure, in the first read mode, the reading means locks out the memory cells of the second group, and in the second read mode, the reading means locks out the memory cells of the first group.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope. The disclosure is described and explained with added specificity and detail through the use of the accompanying drawings in which:

FIG. 1A is a block diagram of an example memory device;

FIG. 1B is a block diagram of an example control circuit;

FIG. 16A is a threshold voltage distribution of a first group of memory cells programmed to MLC;

FIG. 16B is a threshold voltage distribution of a second group of memory cells programmed to MLC;

FIG. 19B depicts voltage waveforms for a range of different components in a memory block during a second part of the read operation of the first embodiment;

DESCRIPTION OF THE ENABLING EMBODIMENT

Figure 2:
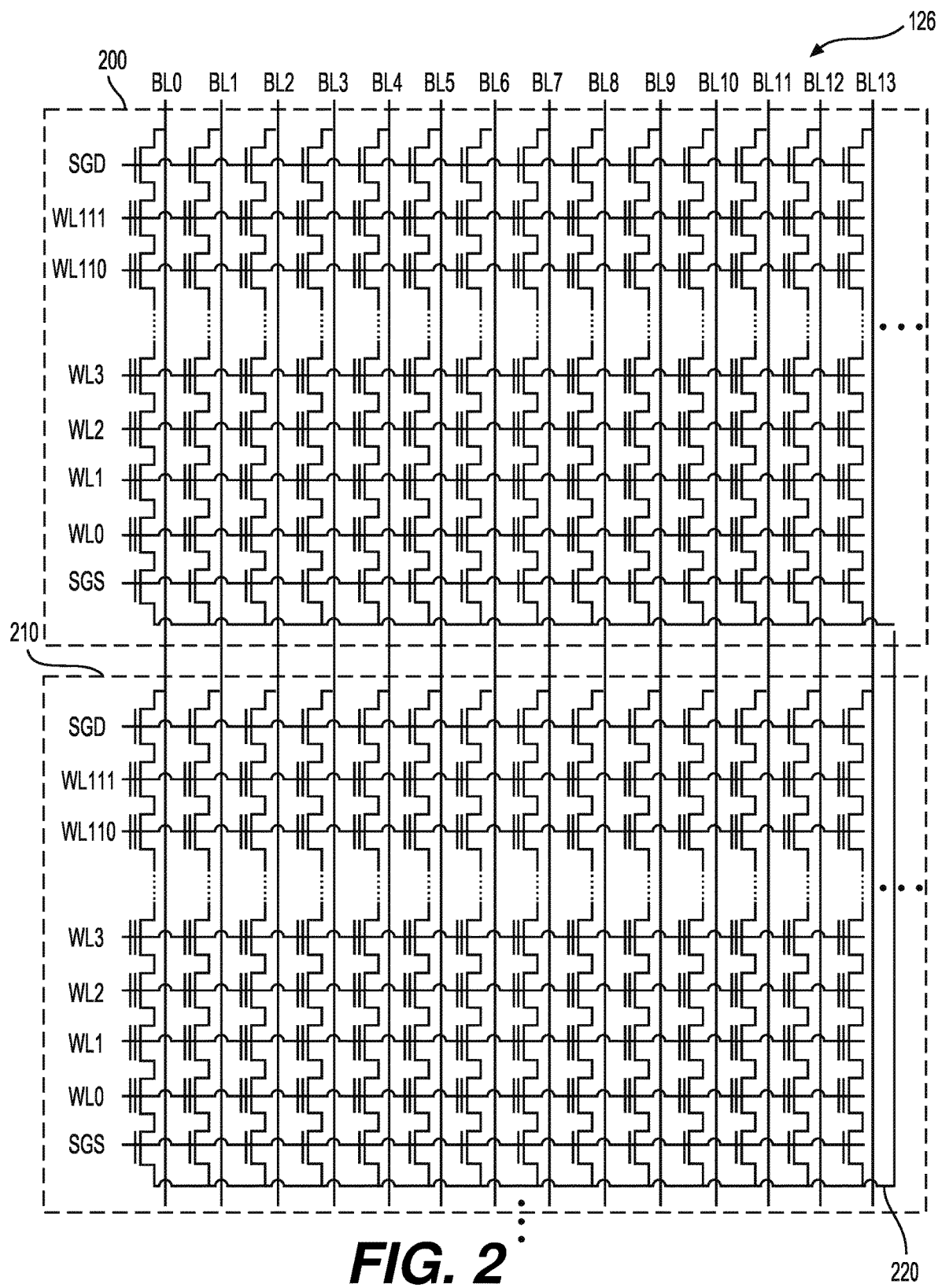
FIG. 2 depicts blocks of memory cells in an example two-dimensional configuration of the memory array of FIG. 1A.

When memory cells are programmed to multiple bits per memory cell in a programming operation that does not include verify operations, it is common for the memory cells that are located on a side of a word line adjacent a word line driver to be programmed to higher threshold voltages than the memory cells on an opposite side of the word line from the word line driver. The present disclosure is related to read techniques whereby the memory cells of a selected word line are divided into a first group, which includes the memory cells adjacent the word line driver, and a second group, which includes the memory cells that are distant from the word line driver. The first group of memory cells are read using a first mode, and the second group of word lines are read using a second mode. By reading the first and second groups through different read modes, read errors are minimized, thereby improving the reliability of the read operation. More details regarding the different read modes are discussed in further detail below.

FIG. 1A is a block diagram of an example memory device that is capable of conducting the aforementioned read techniques. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one selected word line after which the programming circuit applies a verification signal to the selected word line. The control circuits can also include a counting circuit configured to obtain a count of memory cells which pass a verify test for the one data state. The control circuits can also include a determination circuit configured to determine, based on an amount by which the count exceeds a threshold, if a programming operation is completed.

For example, FIG. 1B is a block diagram of an example control circuit 150 which comprises a programming circuit 151, a counting circuit 152, and a determination circuit 153.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exist in some cases. The techniques provided herein reduce the likelihood of uncorrectable errors.

The storage device(s) 122a, 122b comprise, code such as a set of instructions, and the processor 122c is operable to execute the set of instructions to provide the functionality described herein. Alternately or additionally, the processor 122c can access code from a storage device 126a of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122c fetches the boot code from the ROM 122a or storage device 126a for execution, and the boot code initializes the system components and loads the control code into the RAM 122b. Once the control code is loaded into the RAM 122b, it is executed by the processor 122c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

FIG. 2 illustrates blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, . . . which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 220. One hundred and twelve word lines, for example, WL0-WL111, extend between the SGSs and the SGDs. In some embodiments, the memory block may include more or fewer than one hundred and twelve word lines. For example, in some embodiments, a memory block includes one hundred and sixty-four word lines. In some cases, dummy word lines, which contain no user data, can also be used in the memory array adjacent to the select gate transistors. Such dummy word lines can shield the edge data word line from certain edge effects.

Figure 3A:
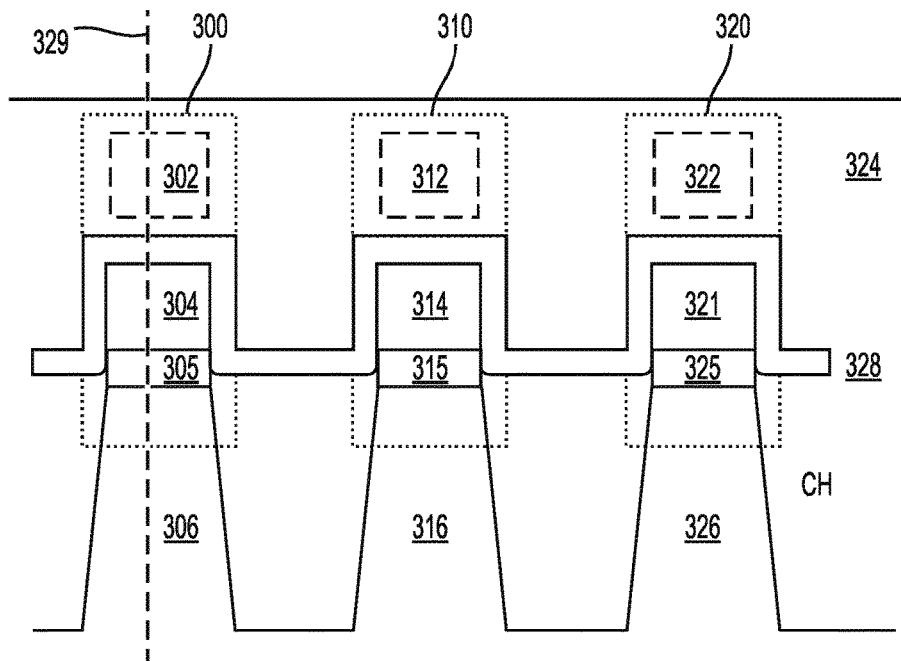
FIG. 3A and FIG. 3B depict cross-sectional views of example floating gate memory cells in NAND strings.
Figure 3B:
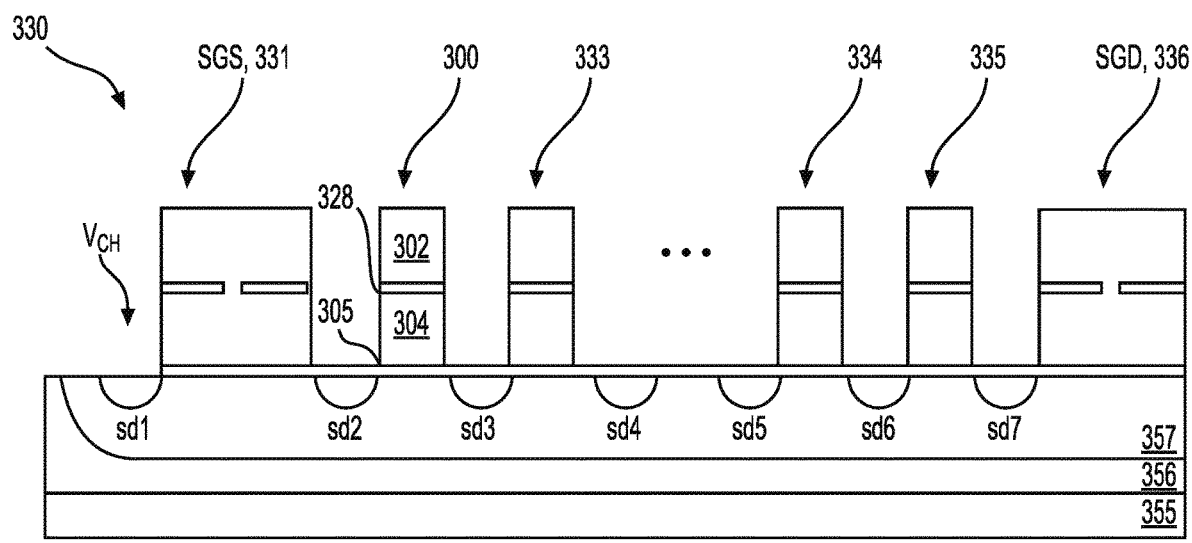

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figure 4A:
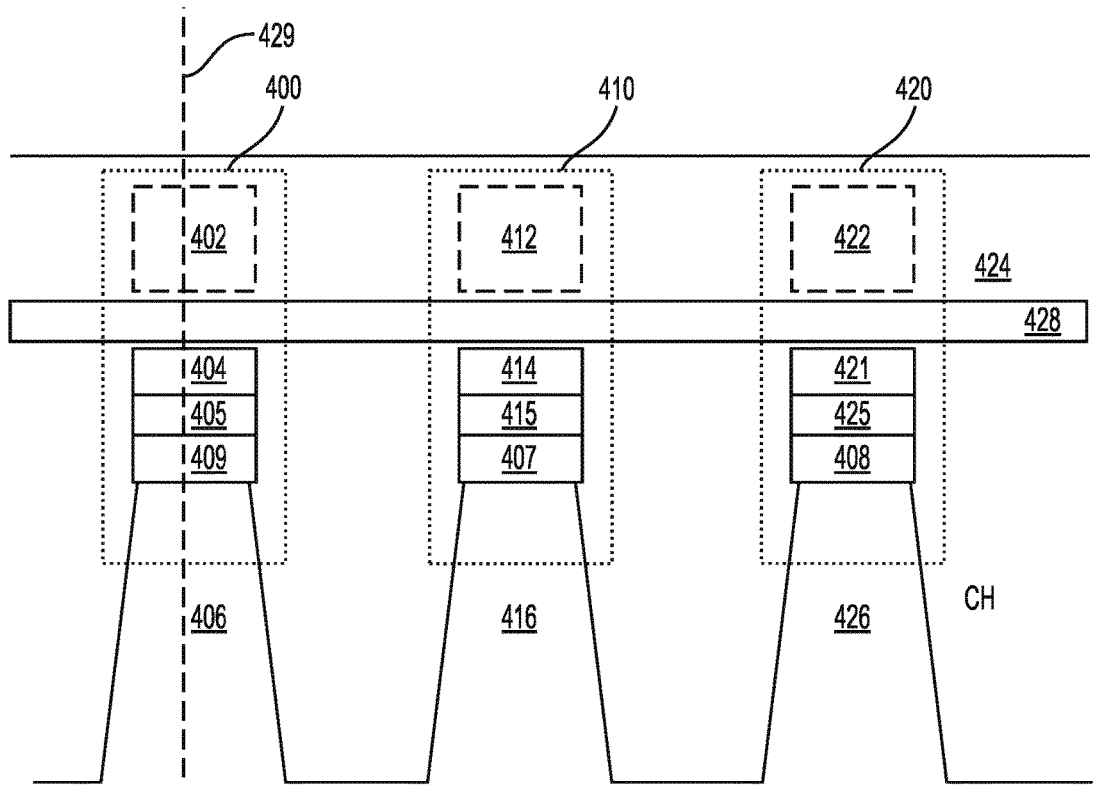
FIG. 4A and FIG. 4B depict cross-sectional views of example charge-trapping memory cells in NAND strings.
Figure 4B:
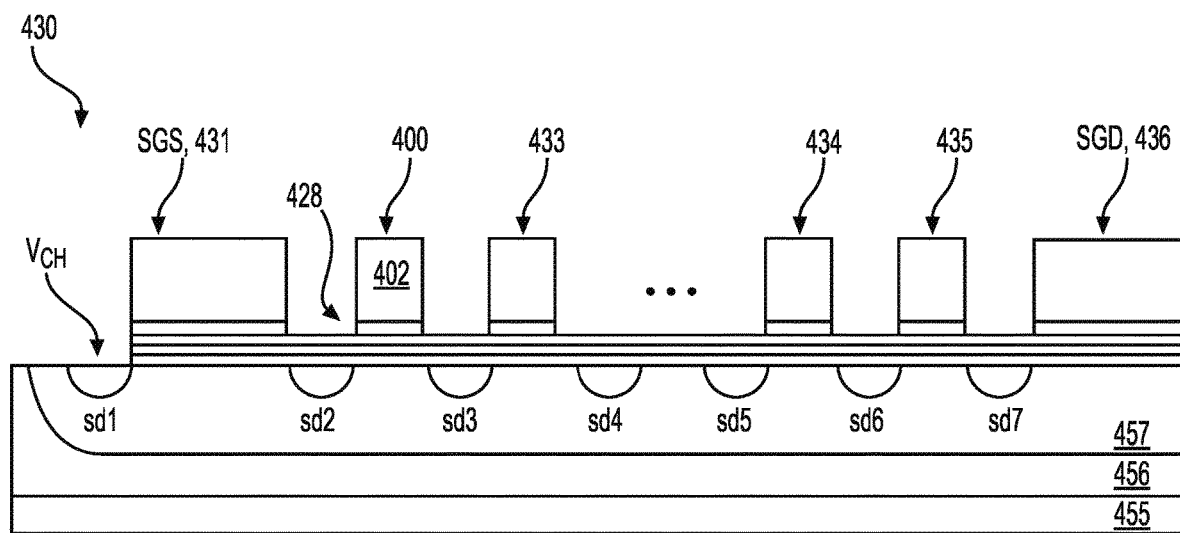

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (0) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
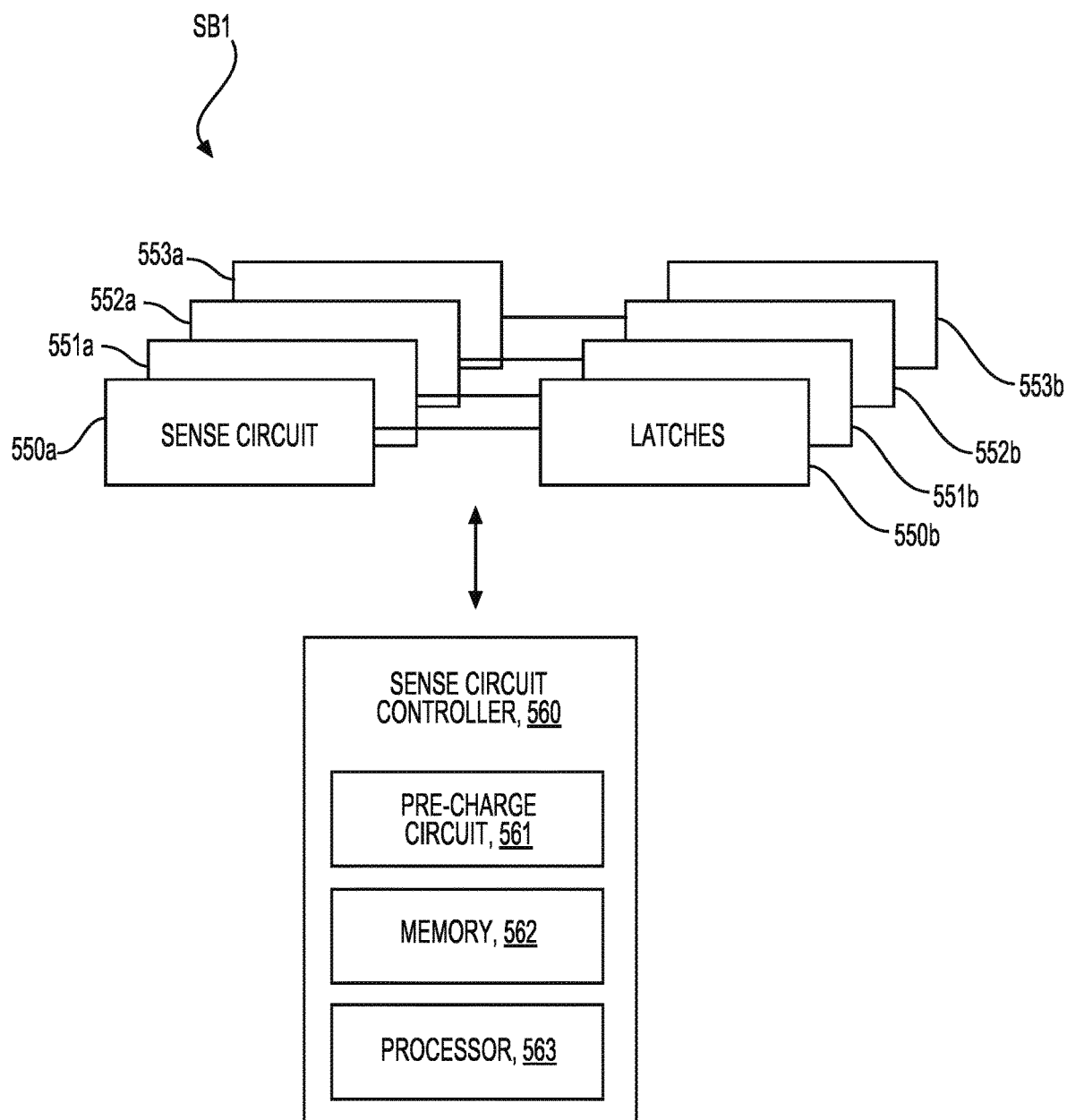
FIG. 5 depicts an example block diagram of the sense block SB1 of FIG. 1.

FIG. 5 illustrates an example block diagram of the sense block SB1 of FIG. 1. In one approach, a sense block comprises multiple sense circuits. Each sense circuit is associated with data latches. For example, the example sense circuits 550a, 551a, 552a, and 553a are associated with the data latches 550b, 551b, 552b, and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550b, 551b, 552b, 553b which are associated with the sense circuits 550a, 551a, 552a, 553a, setting bit values in the latches and providing voltages for setting pre-charge levels in sense nodes of the sense circuits 550a, 551a, 552a, 553a. Further example details of the sense circuit controller 560 and the sense circuits 550a, 551a, 552a, 553a are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
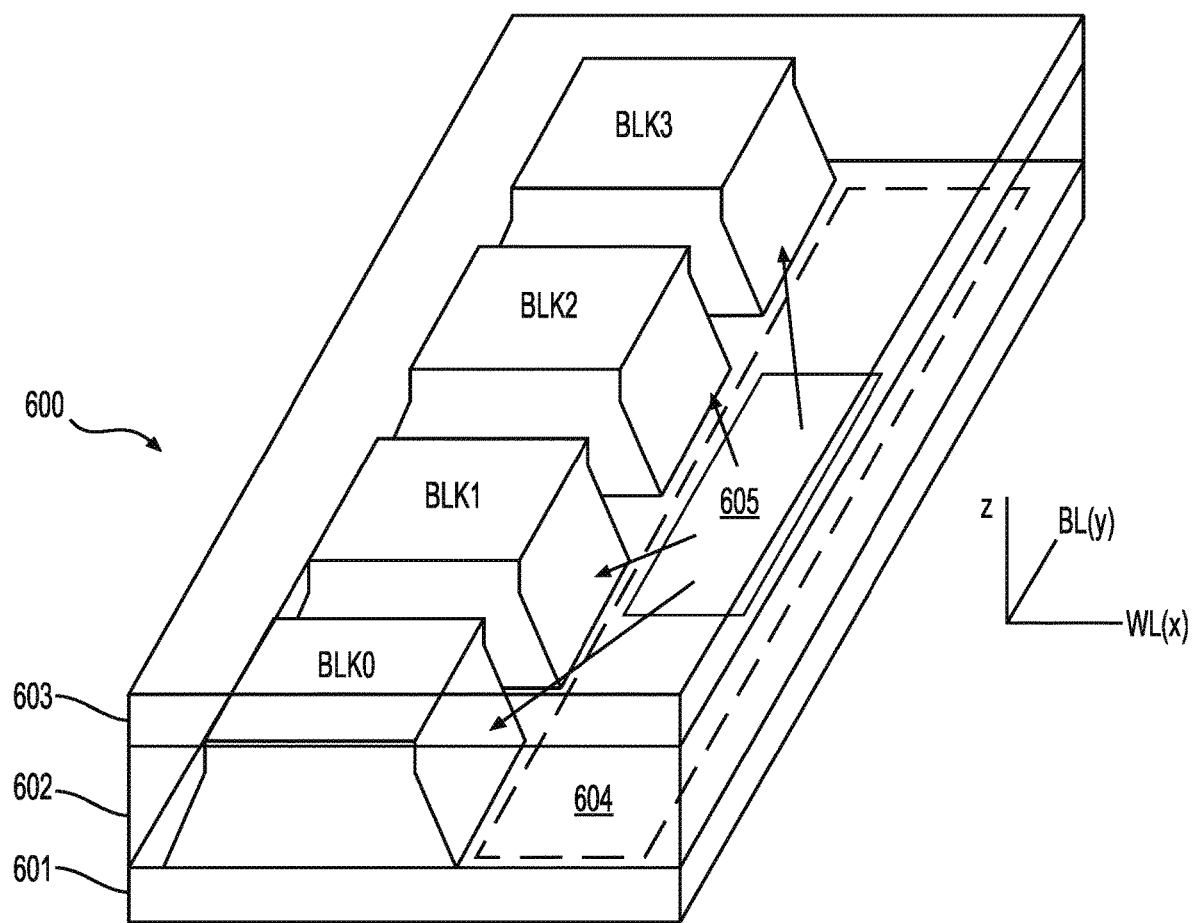
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
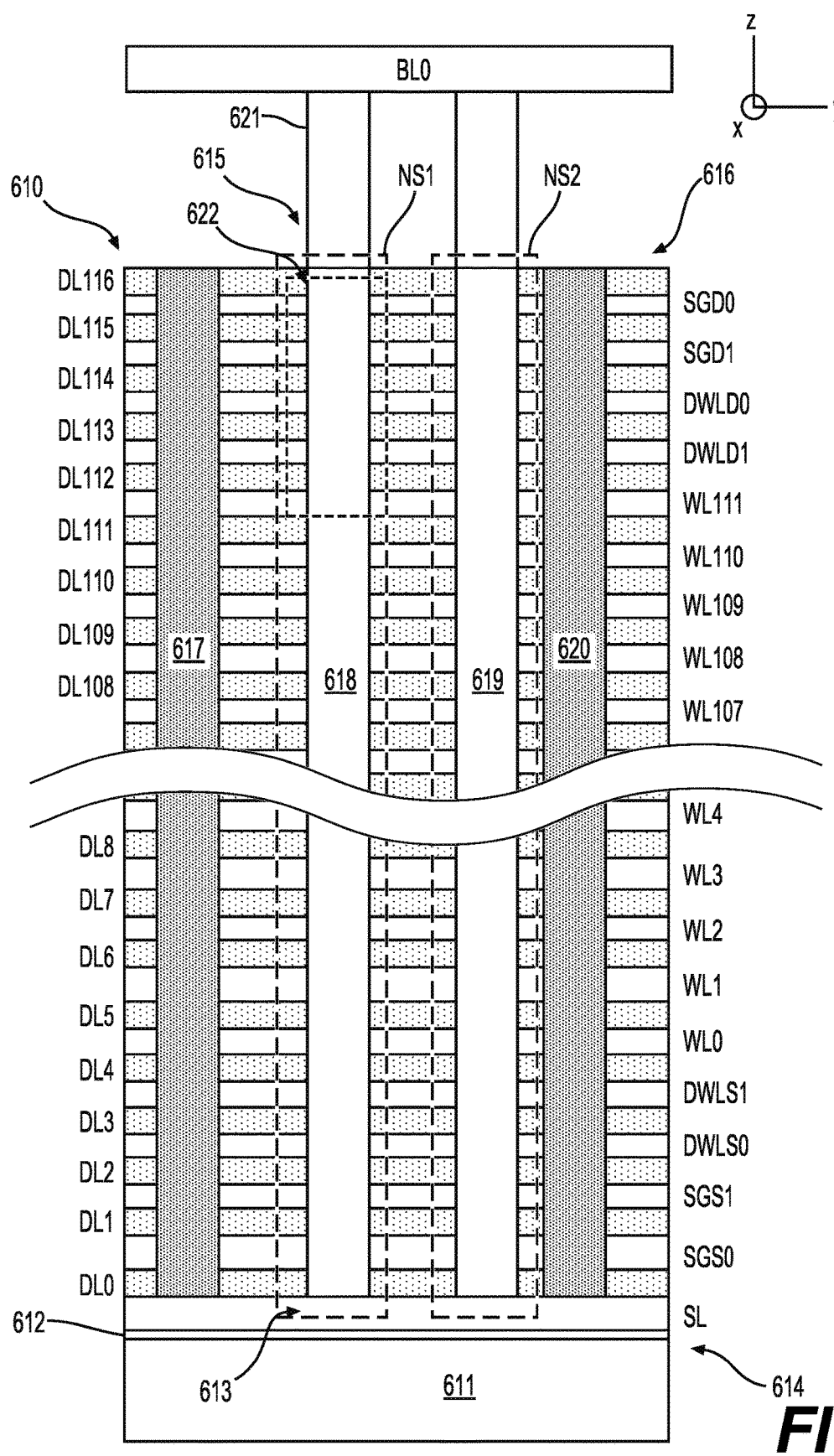
FIG. 6B depicts an example cross-sectional view of a portion of one of the blocks of FIG. 6A.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WL0-WL111. The dielectric layers are labelled as DL0-DL116. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below.

The 610 stack includes a substrate 611, an insulating film 612 on the substrate 611, and a portion of a source line SL. NS1 has a source-end 613 at a bottom 614 of the stack and a drain-end 615 at a top 616 of the stack. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
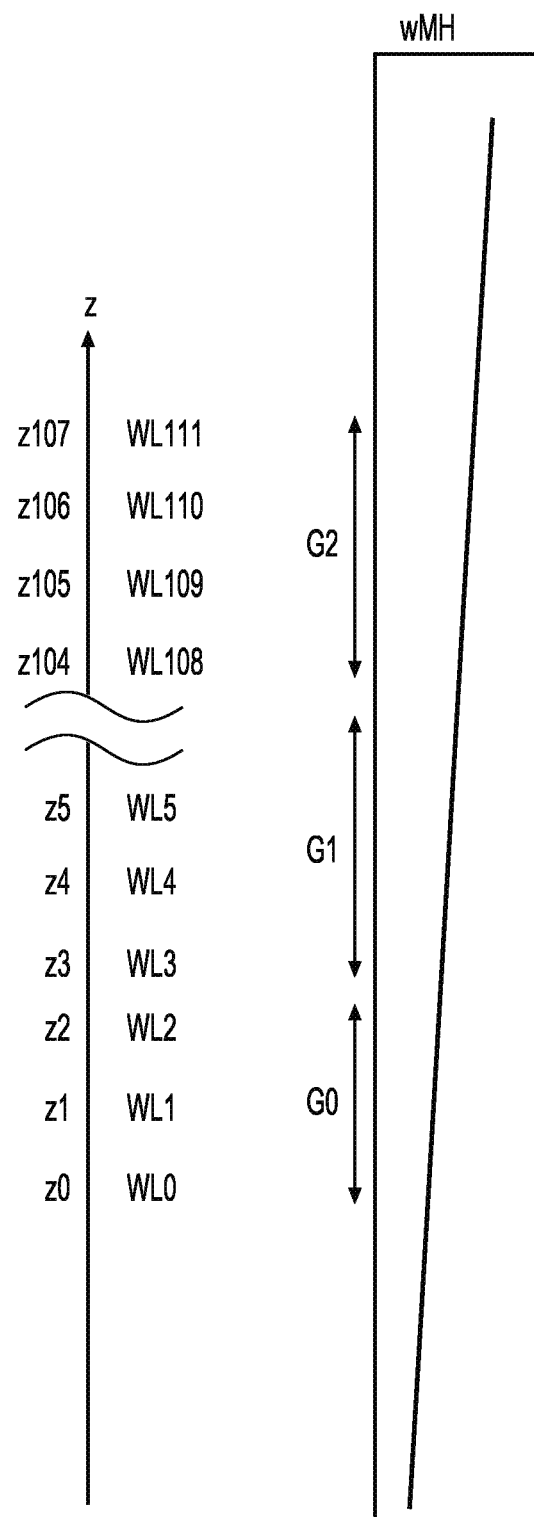
FIG. 6C depicts a plot of memory hole diameter in the stack of FIG. 6B.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WL0-WL111 of FIG. 6A are repeated as an example and are at respective heights z0-z111 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
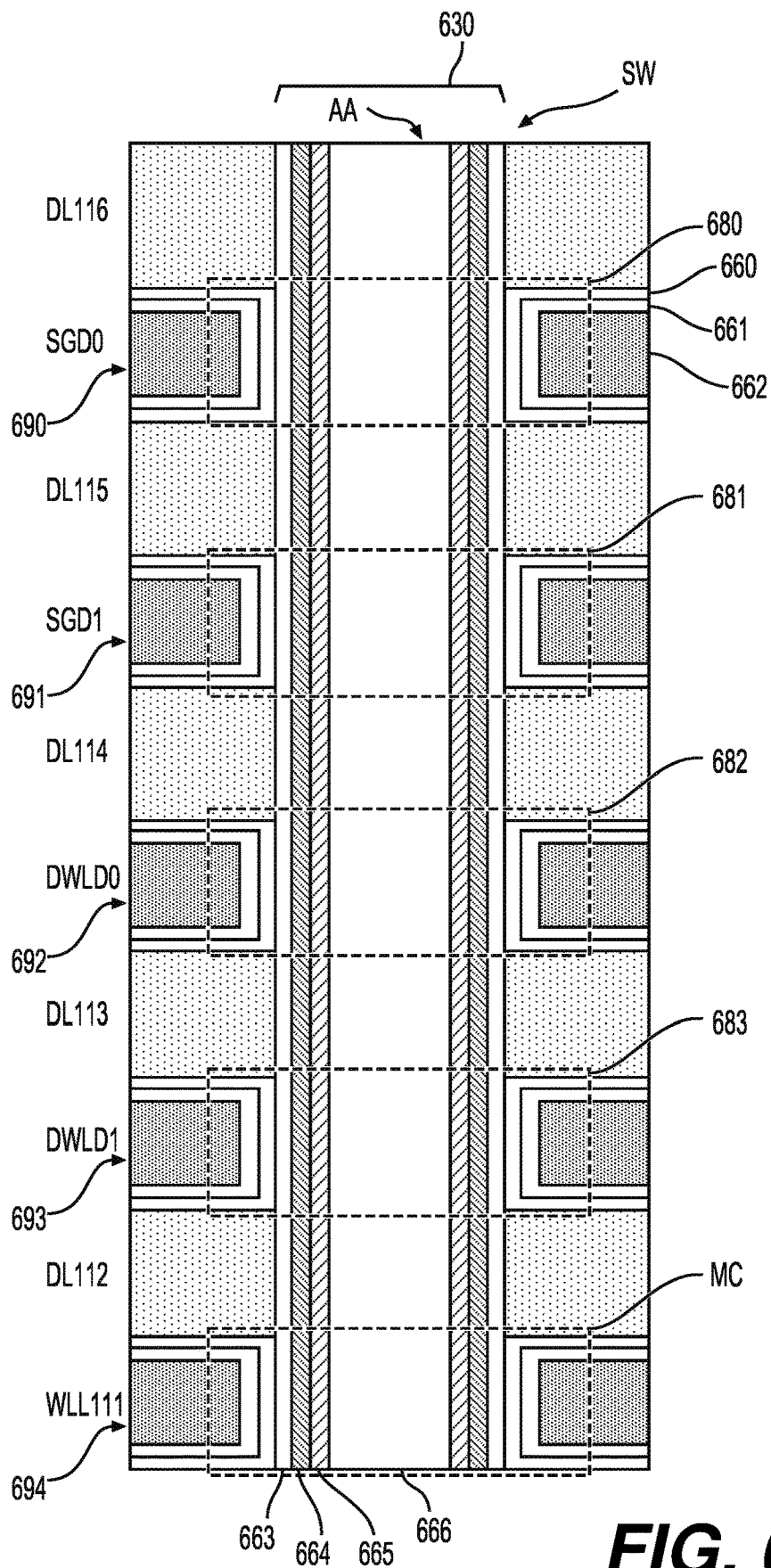
FIG. 6D depicts a close-up view of region 622 of the stack of FIG. 6B.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes 630 can be filled with a plurality of annular layers comprising a blocking oxide layer, a charge trapping layer 663, a tunneling layer 664 and a channel layer. A core region of each of the memory holes 630 is filled with a body material, and the plurality of annular layers are between the core region and the word line in each of the memory holes 630.

The NAND string can be considered to have a floating body channel because the length of the channel is not formed on a substrate. Further, the NAND string is provided by a plurality of word line layers above one another in a stack, and separated from one another by dielectric layers.

Figure 7A:
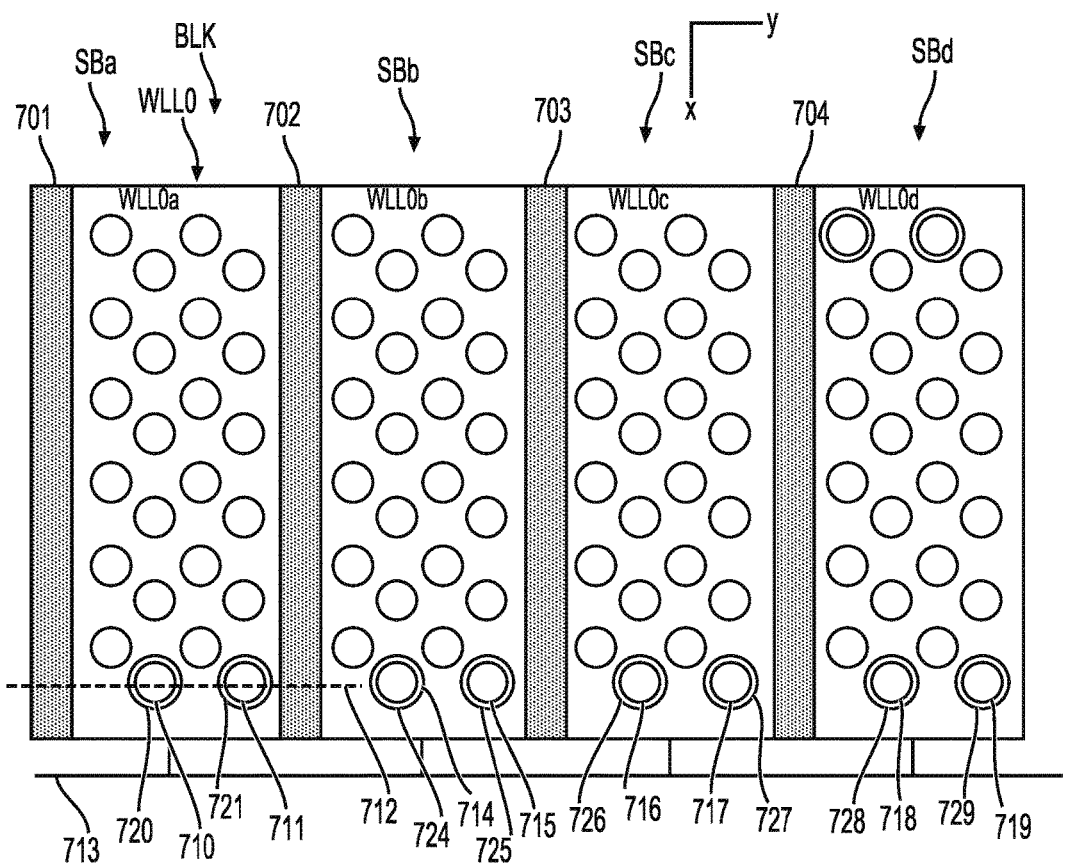
FIG. 7A depicts a top view of an example word line layer WLL0 of the stack of FIG. 6B.

FIG. 7A illustrates a top view of an example word line layer WL0 of the stack 610 of FIG. 6B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

Figure 7B:
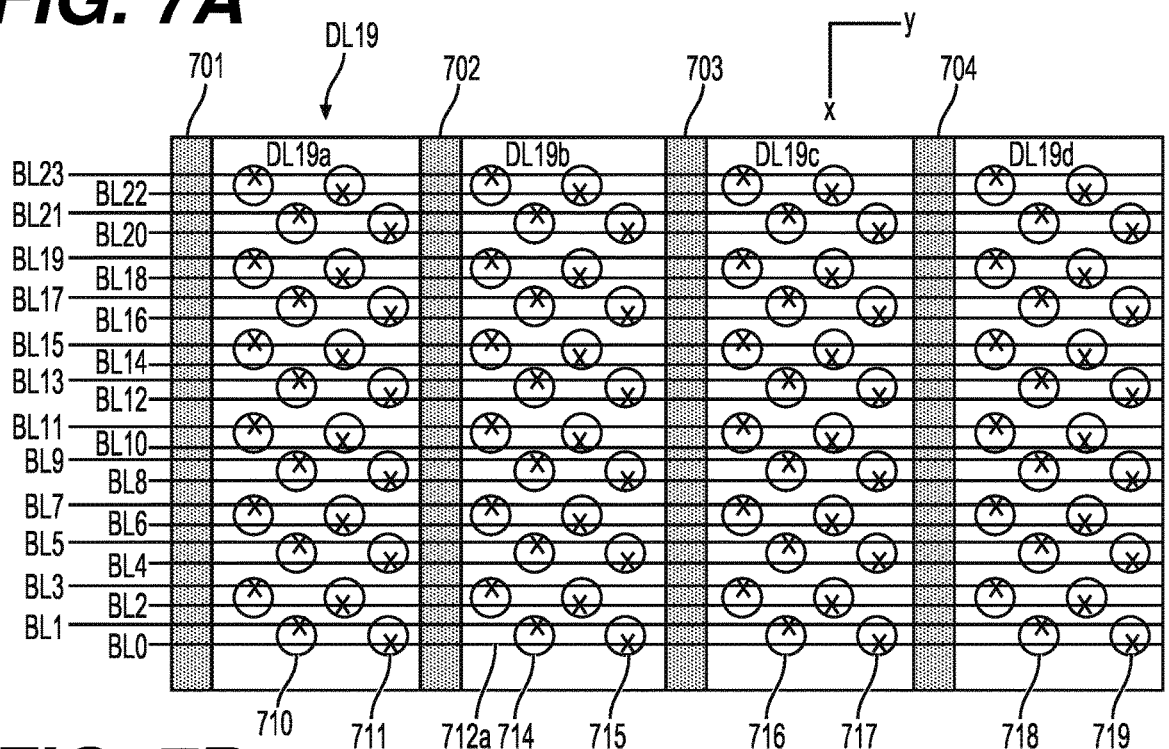
FIG. 7B depicts a top view of an example top dielectric layer DL116 of the stack of FIG. 6B.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WL0a, WL0b, WL0c and WL0d which are each connected by a contact line 713. The last region of a word line layer in a block can be connected to a first region of a word line layer in a next block, in one approach. The contact line 713, in turn, is connected to a voltage driver for the word line layer. The region WL0a has example memory holes 710, 711 along a contact line 712. The region WL0b has example memory holes 714, 715. The region WL0c has example memory holes 716, 717. The region WL0d has example memory holes 718, 719. The memory holes are also shown in FIG. 7B. Each memory hole can be part of a respective NAND string. For example, the memory holes 710, 714, 716 and 718 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 720, 721 are in WL0a, memory cells 724, 725 are in WL0b, memory cells 726, 727 are in WL0c, and memory cells 728, 729 are in WL0d. These memory cells are at a common height in the stack.

Contact line connectors (e.g., slits, such as metal-filled slits) 701, 702, 703, 704 may be located between and adjacent to the edges of the regions WL0a-WL0d. The contact line connectors 701, 702, 703, 704 provide a conductive path from the bottom of the stack to the top of the stack. For example, a source line at the bottom of the stack may be connected to a conductive line above the stack, where the conductive line is connected to a voltage driver in a peripheral region of the memory device.

FIG. 7B illustrates a top view of an example top dielectric layer DL116 of the stack of FIG. 6B. The dielectric layer is divided into regions DL116a, DL116b, DL116c and DL116d. Each region can be connected to a respective voltage driver. This allows a set of memory cells in one region of a word line layer being programmed concurrently, with each memory cell being in a respective NAND string which is connected to a respective bit line. A voltage can be set on each bit line to allow or inhibit programming during each program voltage.

The region DL116a has the example memory holes 710, 711 along a contact line 712, which is coincident with a bit line BL0. A number of bit lines extend above the memory holes and are connected to the memory holes as indicated by the "X" symbols. BL0 is connected to a set of memory holes which includes the memory holes 711, 715, 717, 719. Another example bit line BL1 is connected to a set of memory holes which includes the memory holes 710, 714, 716, 718. The contact line connectors (e.g., slits, such as metal-filled slits) 701, 702, 703, 704 from FIG. 7A are also illustrated, as they extend vertically through the stack. The bit lines can be numbered in a sequence BL0-BL23 across the DL116 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

Figure 8:
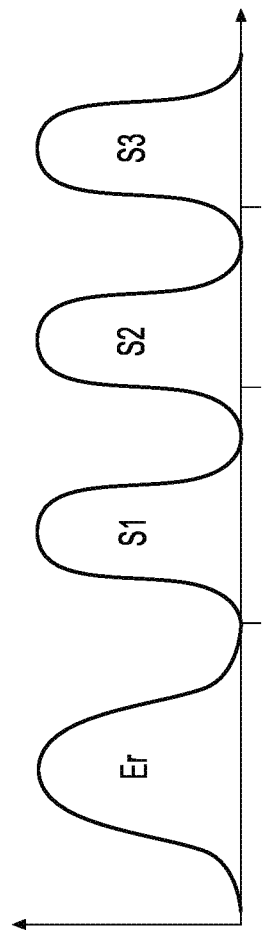
FIG. 8 depicts a threshold voltage distribution of a group of memory cells programmed to SLC (one bit of data per memory cell)
Figure 9:
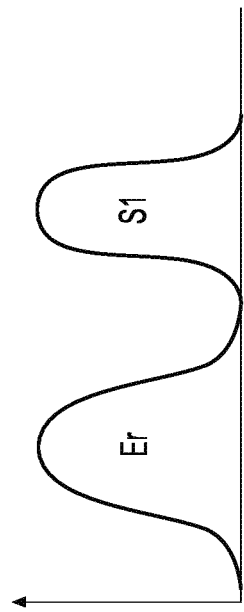
FIG. 9 depicts a threshold voltage distribution of a group of memory cells programmed to MLC (tow bits of data per memory cell)
Figure 10:
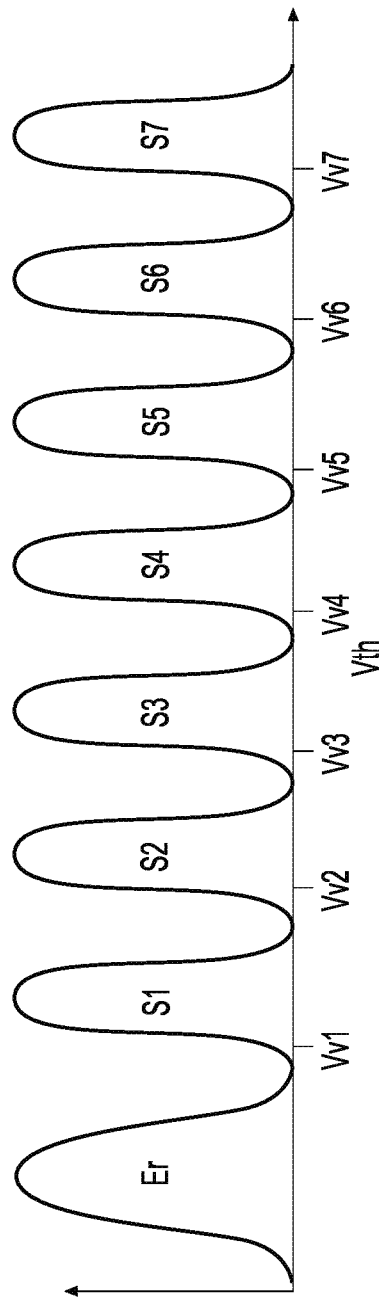
FIG. 10 depicts a threshold voltage distribution of a group of memory cells programmed to TLC (three bits of data per memory cell)

The memory cells can be programmed to store one or multiple bits of data in $2^n$ data states where n is a positive integer. Each data state is associated with a respective threshold voltage Vt. For example, FIG. 8 depicts a threshold voltage Vt distribution of a one bit per memory cell (SLC) storage scheme. In an SLC storage scheme, there are two total data states, including the erased state (Er) and a single programmed data state (S1). FIG. 9 illustrates the threshold voltage Vt distribution of a two bits per cell (MLC) storage scheme that includes four total data states, namely the erased state (Er) and three programmed data states (S1, S2, and S3). Other storage schemes are also available, such as three bits per cell (TLC) with eight data states or four bits per cell (QLC) with sixteen data states.

Programming to MLC, TLC or QLC typically occurs in a plurality of program loops, each of which includes the application of a programming pulse Vpgm to the control gate of a selected word line. During the programming pulse Vpgm, the bit lines coupled to the memory holes are either held at a low voltage (for example, zero Volts) to encourage programming or are held at a higher inhibit voltage to discourage programming. Programming occurs when electrons move into the charge trapping materials of the memory cells coupled to the bit lines that are held at a low voltage, thereby raising the threshold voltages Vt of those memory cells. Conversely, the movement of electrons into the memory cells that are coupled to the bit lines at the inhibit voltage is restricted. When programming to TLC or QLC, the programming pulse is typically followed by the application of a verify pulse to sense the threshold voltages Vt of the memory cells to determine if they have completed programming. However, in many MLC programming techniques, no verify operations are performed. For example, in a 3POV programming operation, memory cells are programmed to MLC in only three program loops, which each include a programming pulse and zero verify pulses. In a first programming pulse, programming is inhibited in the memory cells being held in the erase Er data state and proceeds in the memory cells being programmed to the S1, S2, and S3 data states. In a second programming pulse, programming is inhibited in the memory cells being held in the Er and S1 data states and proceeds in the memory cells being programmed to the S2 and S3 data states. In the third programming pulse, programming is inhibited in the memory cells being held in the Er, S1, and S2 data states and proceeds in the memory cells being programmed to the S3 data state. The result of a 3POV programming operation is three natural threshold voltage nVt distributions, one for each programmed data state S1, S2, S3, because no verify operations were conducted.

Figure 11:
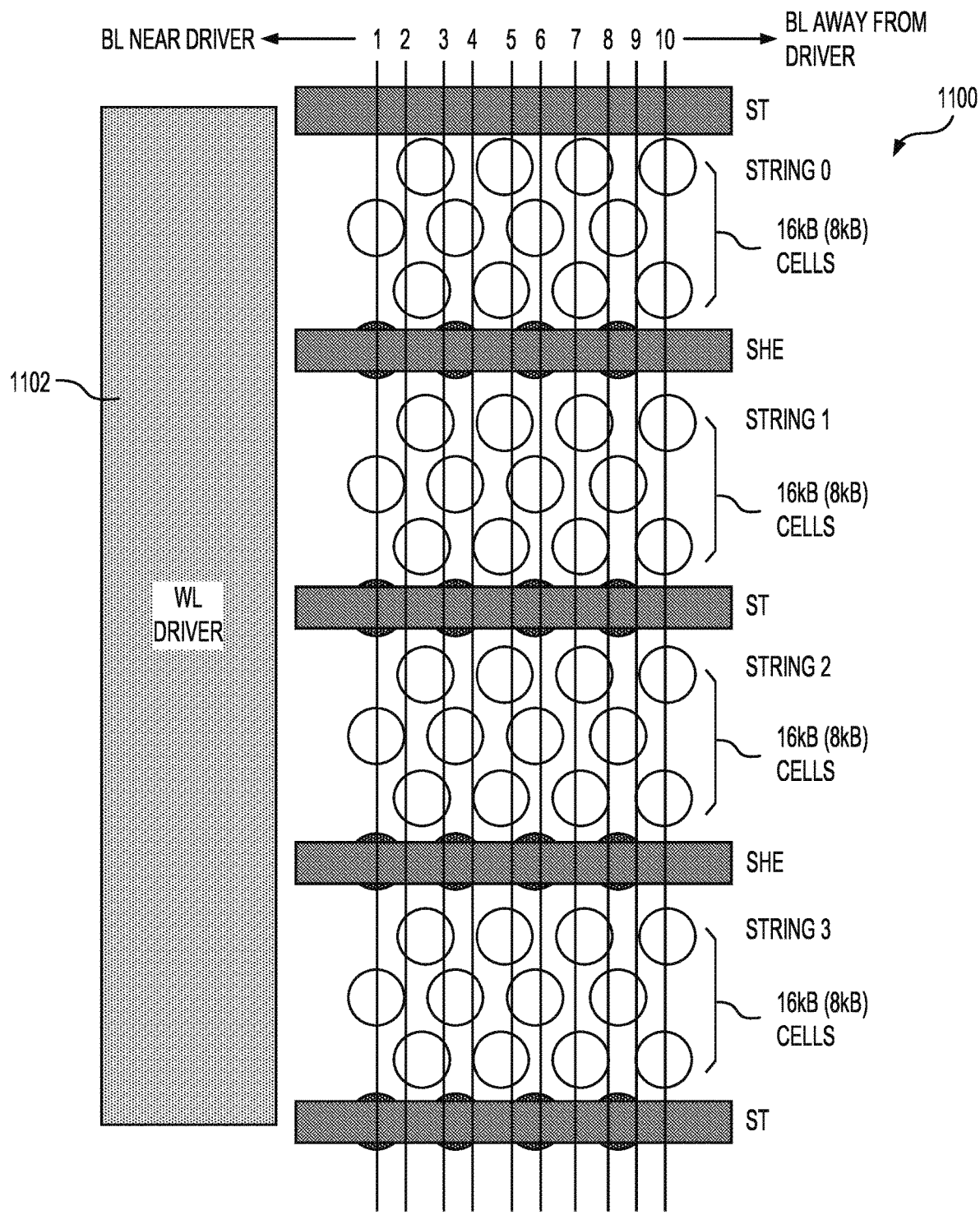
FIG. 11 is a schematic view of an example memory block as viewed from above the memory block.

Turning now to FIG. 11, a schematic view of an example memory block 1100 that includes four strings (labeled String 0, String 1, String 2, and String 3) is shown. The memory block 1100 includes a word line driver 1102, which generates the programming voltage Vpgm and supplies the programming voltage Vpgm to the word lines during programming. As viewed from the top of the memory block 1100, which is the perspective shown in FIG. 11, the word line driver 1102 is located on one side of the strings and the word lines. Thus, during programming, the programming voltage Vpgm is supplied by the word line driver 1102 to one side of the word lines. Although only ten bit lines (labeled 1-10) are illustrated in this Figure, in some examples, each string includes either 8,000 (8k) or 16,000 (16k) bit lines, each of which is coupled to a unique memory hole. In other words, the memory block 1100 in reality is substantially larger than the one depicted in FIG. 11, and the distance between the word line driver 1102 and the memory cells coupled to the furthest bit lines can be relatively large.

Figure 13:
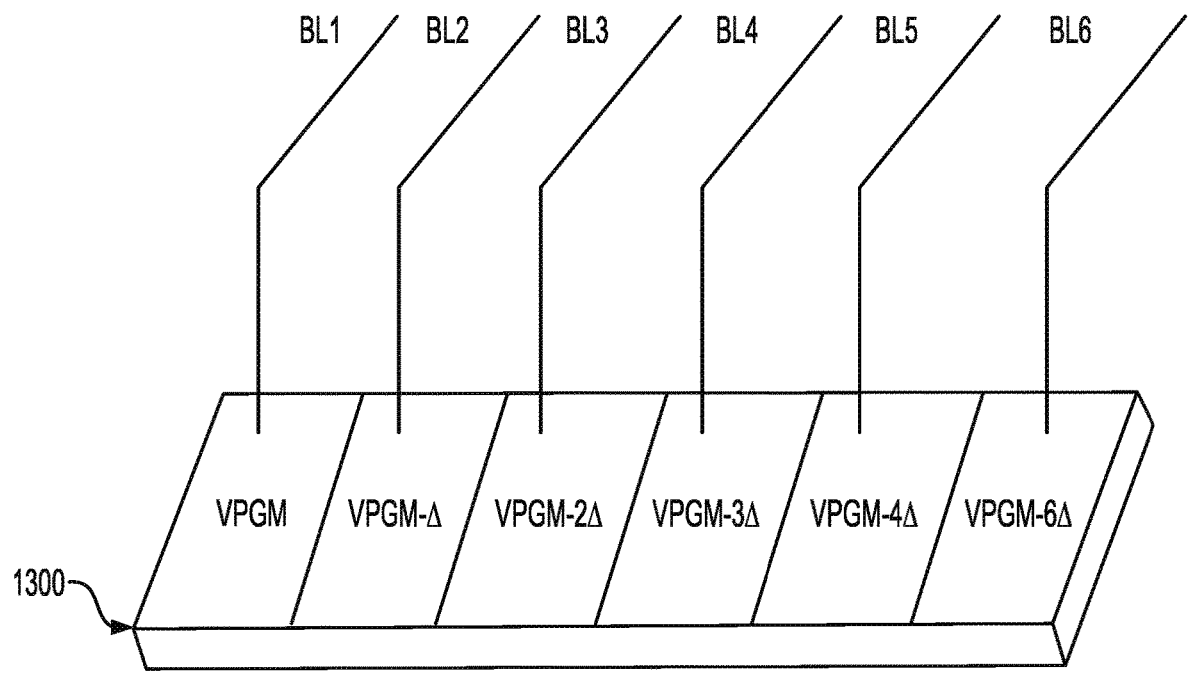
FIG. 13 is a schematic view of an example word line and illustrating the different programming voltages that different portions of the word line experience during a programming operation.

The word lines have the form of metal pads, and due to inherent resistances and capacitances of the word lines, in each word line, the programming voltage Vpgm is going to ramp more quickly on one side of the word line (the side nearest the word line driver) than on an opposite side of the word line (the side furthest from the word line driver). This phenomenon, which is hereinafter referred to as "RC delay," is schematically illustrated in a selected word line WL 13000 in FIG. 13, with the symbol A identifying a decrease in programming voltage Vpgm from one portion of the word line to the next portion of the word line 1300 during ramp-up. In this example, for illustration purposes, only six bit lines are illustrated (BL1-BL6), and the word line 1300 is illustrated as if it is segmented into six portions. The portion of the word line 1300 that is in communication with BL1 is the portion of the word line 1300 that is nearest the word line driver, and therefore this portion receives the highest programming voltage Vpgm during a programming operation. The portion of the word line 1300 that is in communication with BL2 receives a lesser programming voltage Vpgm-A because it is located further from the word line driver. The portion of the word line 1300 that is in communication with BL3 receives a still lesser programming voltage Vpgm-2A because it is still further from the word line driver. This pattern continues across the word line 1300 with the programming voltage decreasing as the distance from the word line driver grows.

Figure 12:
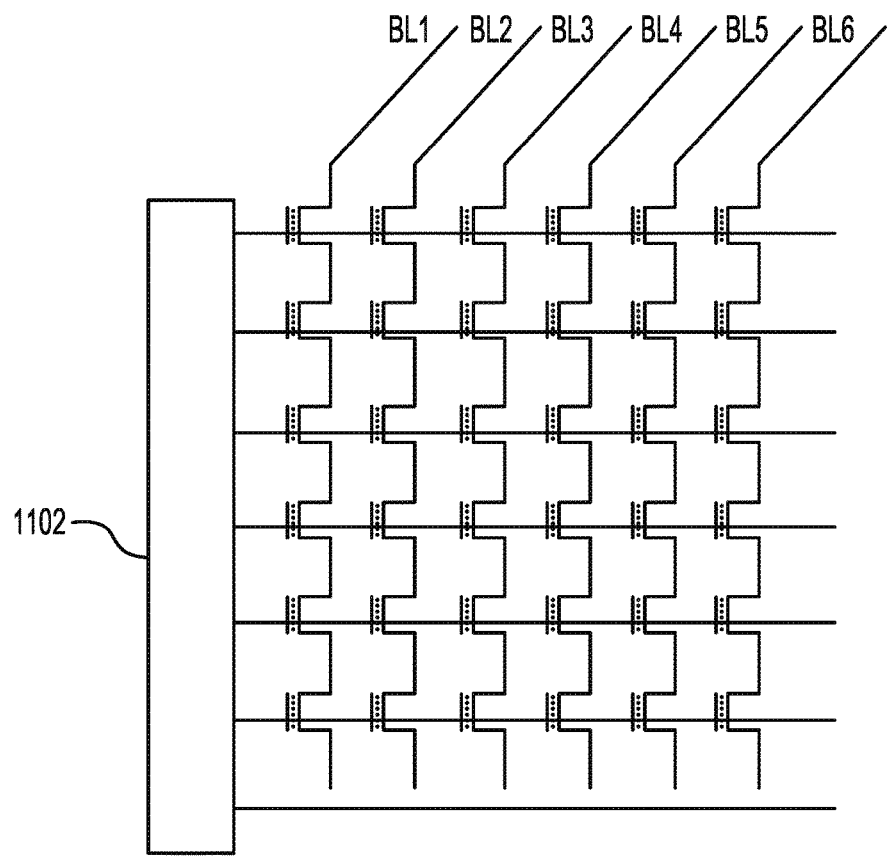
FIG. 12 is another schematic view of the example memory block as viewed from a side of the memory block.

Turning now to FIG. 12, because of RC delay, the memory cells that are coupled to bit lines that are closer to the word line driver 1102 will receive a larger programming voltage and will be programmed further (to a higher threshold voltage Vt) in each programming pulse of a 3POV programming operation than the memory cells that are coupled to bit lines which are further from the word line driver 1102. In other words, within a given word line, the memory cells that are near the word line driver 1102 program more efficiently than the memory cells that are further from the word line driver 1102.

Figure 14:
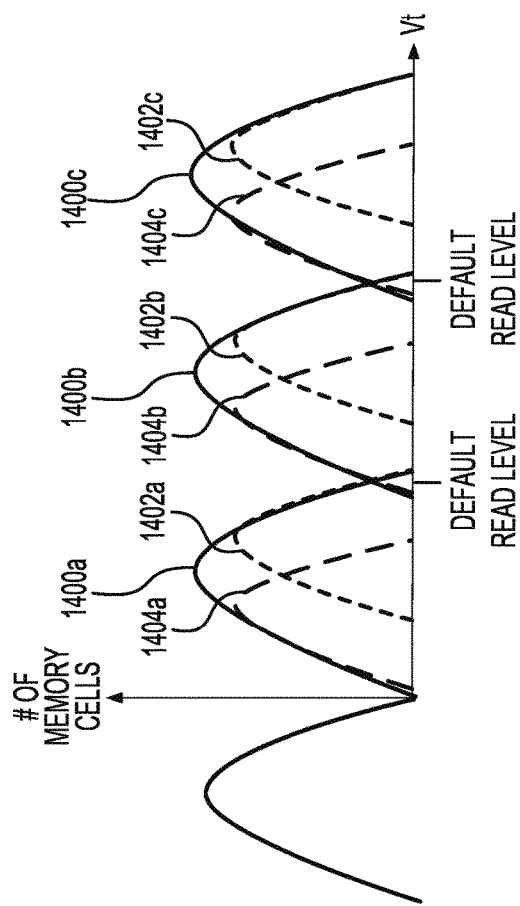
FIG. 14 is a threshold voltage distribution of a plurality of memory cells programmed to MLC and showing sub-curves of the threshold voltage distributions of two different groups of the plurality of memory cells.

The inconsistent programming between the memory cells that are close to the voltage driver and the memory cells that are distant from the voltage driver results in the threshold voltage Vt distribution shown in FIG. 14. In this Figure, curves 1400a, 1400b, and 1400c represent the overall threshold voltage Vt distributions of memory cells in a word line programmed to the S1, S2, and S3 data states respectively using a 3POV programming operation. Due to RC delay and the different programming efficiencies of the memory cells on different sides of the word line each of these curves 1400a, 1400b, 1400c includes sub-curves comprising the memory cells of two groups: a first group and a second group. The first group includes the memory cells that are near the voltage driver, and the Vt distributions of the first group are identified by sub-curves 1402a, 1402b, 1402c. The second group includes the memory cells that are distant from the voltage driver, and the Vt distributions of the second group are identified by the sub-curves 1404a, 1404b, 1404c. As illustrated, for each of the S1, S2, and S3 programmed data states, the threshold voltages Vt of the second group of memory cells are lower than those of the first group of memory cells due to the RC delay effect. As such, the second group of memory cells contribute substantially to the lower tails of the overall curves 1400a, 1400b, 1400c, and the first group of memory cells contribute substantially to the upper tails of the overall curves 1400a, 1400b, 1400c. As indicated in FIG. 14, in many read operations, the default read levels for data states S2 and S3 are typically set at voltage levels where the upper tail of the Vt distribution of the first group of memory cells of one data state (for example, S1) crosses over with the lower tail of the Vt distribution of the second group of memory cells of the next data state (for example, S2). This can lead to some failed bit counts (FBCs) where a memory cell of one data state (for example, S1) is mistakenly read as being in the next data state (for example, S2).

According to an aspect of the present disclosure, read techniques are implemented to improve read reliability by reducing FBCs. This improved reliability is achieved by reading the memory cells of the first group in a different way than the memory cells of the second group. Various embodiments of accomplishing these new and unexpected results are discussed in further detail below.

Figure 15:
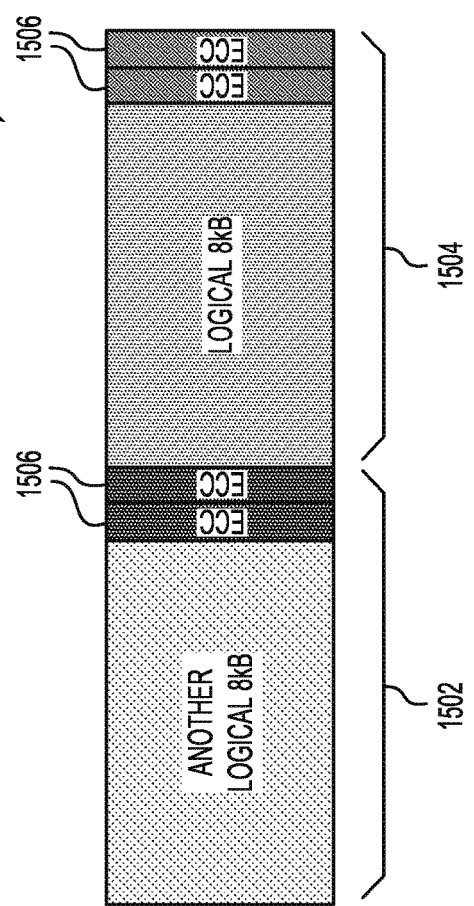
FIG. 15 is a schematic view of an example word line.

With reference to FIG. 15, in each of the embodiments, the memory cells of a word line 1500 and the bit lines that are coupled to those memory cells are separated into two groups: a first group 1502 that includes the half of memory cells that are near the word line driver and a second group 1504 that includes the other half of the memory cells, which are distant from the word line driver. The first group 1500 includes the memory cells that low bit line addresses, and the second group 1502 includes the memory cells that have high bit line addresses. In an example where each word line includes sixteen-thousand (16,000) memory cells, the first group 1502 includes the memory cells that are coupled with bit lines BL1-BL8,000, and the second group 1504 includes the memory cells that are coupled with bit lines BL8,001-BL16,000. Thus, the first and second groups 1502, 1504 have approximately the same number of memory cells and the same number of bit lines in them. In an alternate embodiment where each word line includes eight thousand (8,000) memory cells, the first group includes the memory cells that are coupled with bit lines BL1-BL4,000, and the second group includes the memory cells that are coupled with bit lines BL4,001-BL8,000. In some other embodiments, the memory cells may have other numbers of memory cells and bit lines.

Each of the first and second groups 1502, 1504 includes a plurality of error correction coding (ECC) memory cells 1506, which are configured to retain error correction data to correct read errors that may occur. These ECC memory cells 1506 are located at the ends of both of the first and second groups 1502, 1504, i.e., they are coupled to the bit lines with the highest addresses in each group. In the exemplary embodiment where each word line has sixteen thousand (16,000) memory cells, the ECC memory cells 1506 of the first group 1502 may be the memory cells that are coupled to bit lines BL7,950-BL8,000, and the ECC memory cells 1506 of the second group 1504 may be the memory cells that are coupled to bit lines BL15,550-BL16,000. Thus, approximately half of the ECC memory cells 1506 of the word line are located in the first group 1502 of memory cells, and half of the ECC memory cells are located in the second group 1504. This is in contrast to some other known configurations where all of the ECC memory cells are located at the end of the word line.

Referring additionally now to FIGS. 16A and 16B, after programming, the first and second groups 1502, 1504 have different threshold voltage Vt distributions for each of the programmed data states (S1, S2, S3) with the memory cells of the first group 1502 (FIG. 16A) being programmed, on average, to a higher threshold voltage Vt than the memory cells of the second group 1504 (FIG. 16B). The read techniques of the following embodiments utilize this phenomenon to improver read reliability.

Figure 17A:
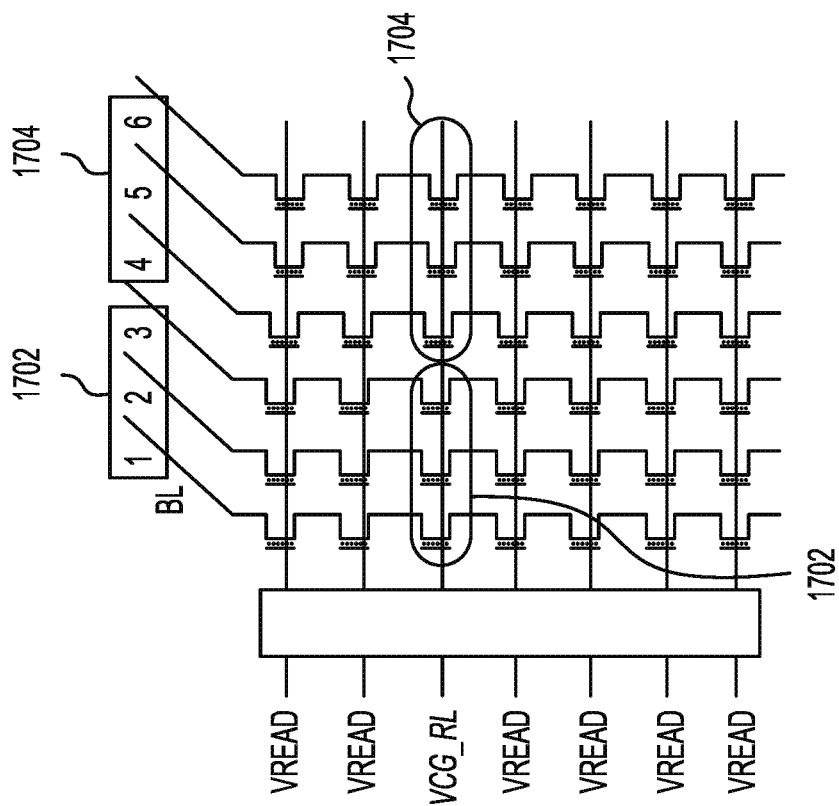
FIG. 17A is a schematic view of a memory device during a first part of a first embodiment of a read operation.
Figure 17B:
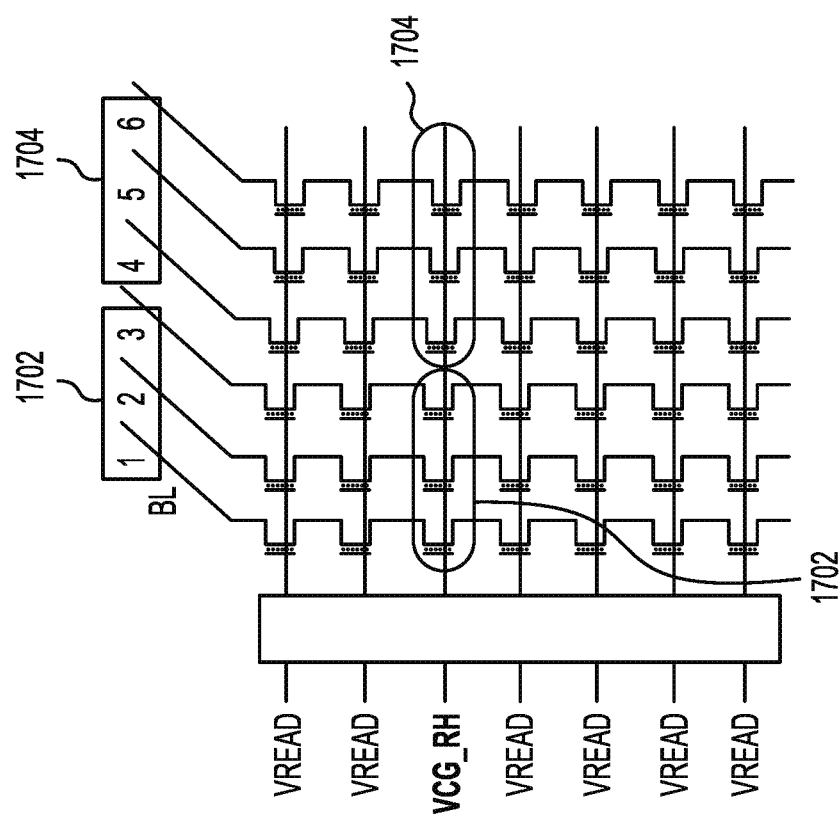
FIG. 17B is a schematic view of a memory device during a second part of a first embodiment of a read operation.
Figure 18:
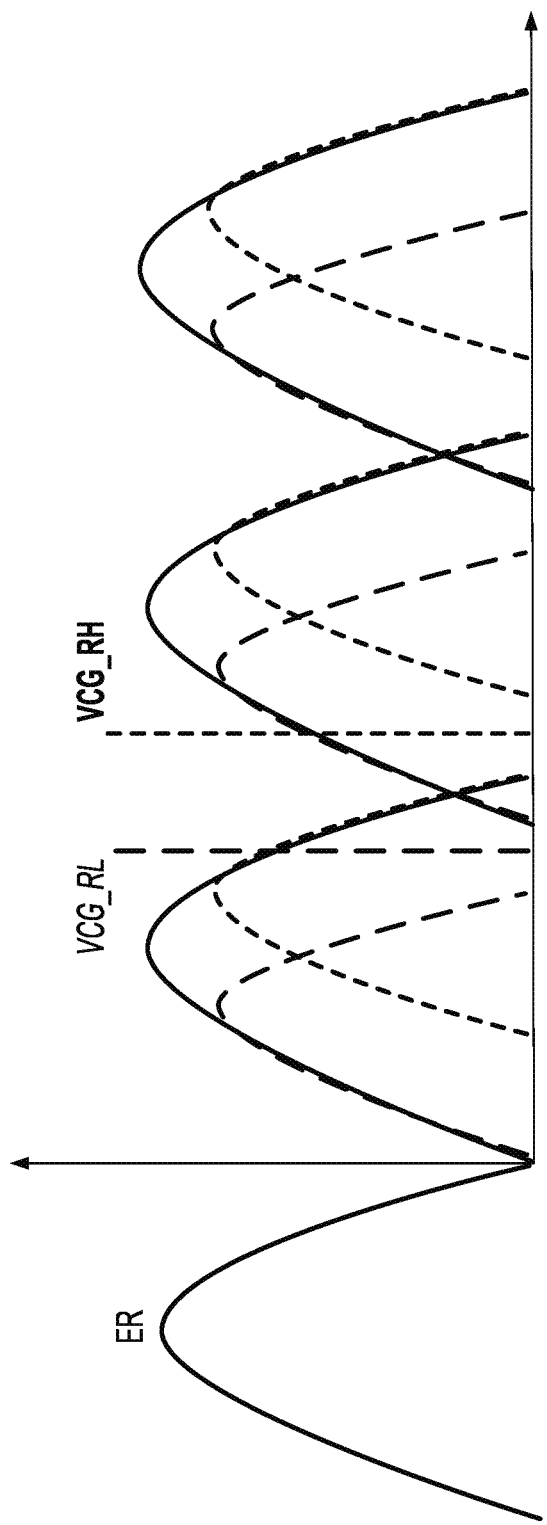
FIG. 18 is a threshold voltage distribution of a plurality of memory cells programmed to MLC and identifying two different read voltages that are applied during read operations of the first and second groups of memory cells.

Referring now to FIGS. 17A, 17B, and 18, in a first embodiment, in order to improve read reliability, a read operation of a selected word line programmed using a 3POV programming operation is divided into two parts: a first part where the first group 1702 of memory cells are read and a second part where the second group 1704 of memory cells are read. In FIGS. 17A and 17B and certain other figures to follow, the word line is depicted as having only six memory cells with three being in the first group 1702 and three being in the second group 1704. As discussed above, this is for illustrative purposes and in practice, a word line will typically have substantially more memory cells than this.

As schematically illustrated in FIG. 17A, during the first part of the read operation, a first set of read voltages VCG_RH (corresponding to data states S1, S2, and S3) are applied to the selected word line while the other word lines are held at a conducting voltage VREAD. To lock out (not read) the second group 1704 of memory cells, a VBLC voltage of zero Volts (0 V) is applied to the bit lines of the second group 1704. Conversely, to read (sense) the first group 1702 of memory cells, a higher VBLC voltage is applied to the bit lines of the first group 1702.

Turning now to FIG. 17B, during the second part of the read operation, a second set of read voltages VCG_RL (corresponding to data states S1, S2, and S3) are applied to the selected word line while the other word lines are held at a conducting voltage VREAD. Simultaneously, to lock out the second group 1702 of memory cells, a VBLC voltage of zero Volts (0 V) is applied to the bit lines of the first group 1702. Conversely, to read (sense) the second group 1704 of memory cells, a higher VBLC voltage is applied to the bit lines of the second group 1704.

The second set of read voltages VCG_RL, which are applied during the second part of the read operation, are at lower voltages than the first set of read voltages VCG_RH, which are applied during the first part of the read operation, to account for the fact that the threshold voltages Vt of the memory cells in the second group 1704 are, on average, lower than the threshold voltages Vt of the memory cells in the first group 1702.

FIG. 18 illustrates the voltages of VCG_RL and VCG_RH for the S2 data state according to an example embodiment. As illustrated, while VCG_RL is located within the overall curve 1400a of data state S1, because this read voltage is only applied during read of the second group of memory cells, it will not produce read errors. In fact, read errors and FBCs are substantially reduced. Likewise, while VCH RH is within the overall curve 1400b of the S2 data state, because it is at a lower voltage than the lower tail of the first set of memory cells, it will not produce read errors. VCG_RL and VCH RH for data state S3 follow similar patterns.

Figure 19A:
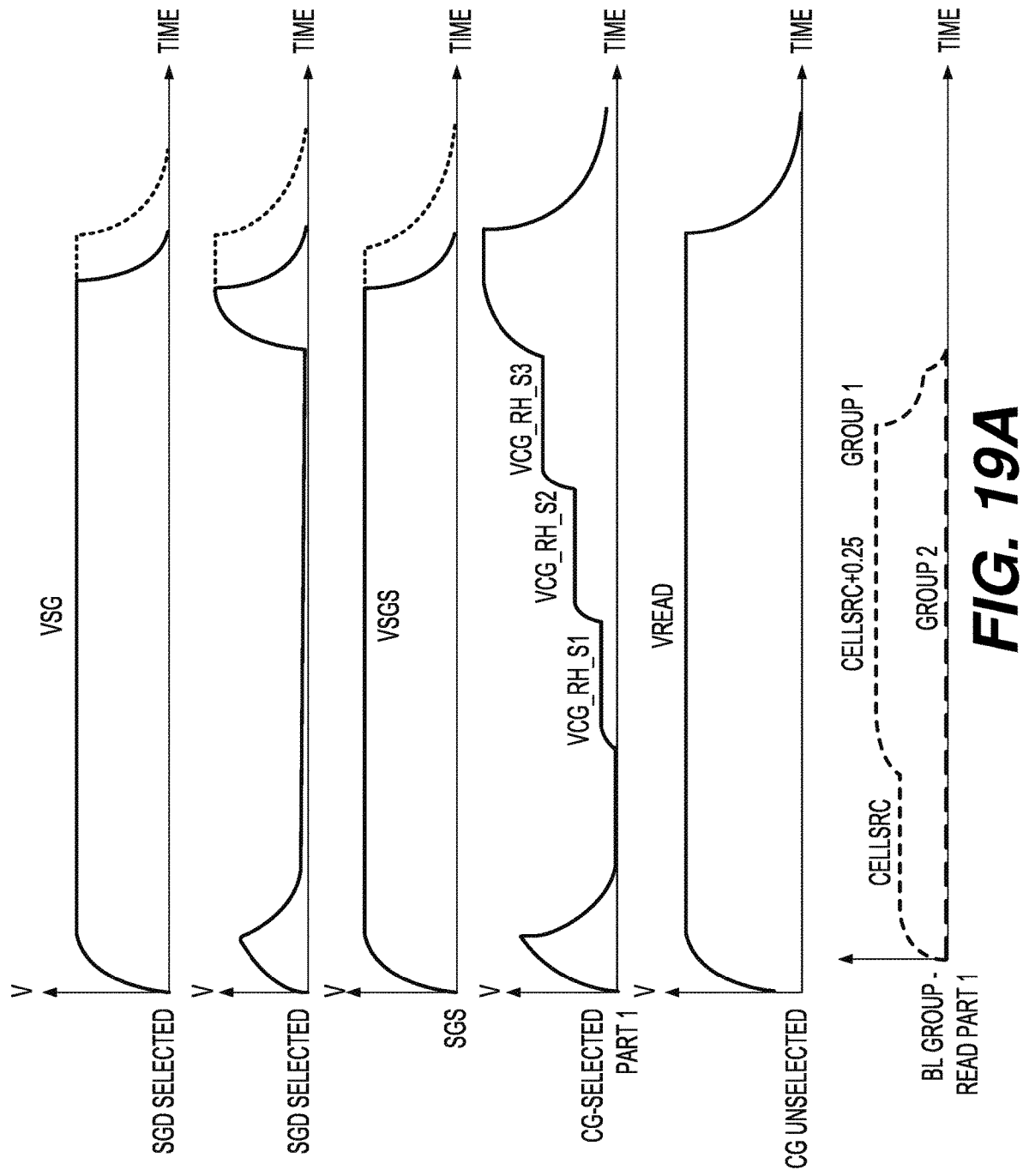
FIG. 19A depicts voltage waveforms for a range of different components in a memory block during a first part of the read operation of the first embodiment.

Turning now to FIG. 19A, depicted herein are the voltage waveforms applied to various components of the memory block during the read operation of the first embodiment of the present disclosure. The selected SGD is held at a high VSG voltage, while the unselected SGDs are maintained at a low voltage, e.g., zero Volts. The SGS is held at a high voltage VSGS. The control gates of the unselected word lines are held at the VREAD voltage to allow the memory cells of the unselected word lines to be in a conductive condition.

During the first part of the read operation, the voltage applied to the bit lines of the first group is ramped to a high voltage (for example, CELLSRC+0.25 V) while the bit lines of the second group are held at zero Volts to lock out the second group of memory cells. The read voltage levels that are applied to the control gate of the selected word line are consistent with the first set of read levels (VCG_RH_S1, VCG_RH_S2, VCG_RH_S3). Thus, during the first part of the read operation, only the memory cells of the first group are read, and those memory cells are read using the higher first set of read voltage levels.

During the second part of the read operation, the voltage waveforms for the selected SGD, the unselected SGDs, the SGS, the control gates of the unselected word lines, and the control gate of the selected word line are all repeated from the first part. During the second read part, the bit lines of the first group are held at zero Volts to lock out the first group of memory cells, and the voltage applied to the bit lines of the second group is ramped to the high voltage (for example, CELLSRC+0.25 V). The read voltage levels that are applied to the control gate of the selected word line are consistent with the second set of read levels (VCG_RL_S1, VCG_RL_S2, VCG_RL_S3). Thus, during the second part of the read operation, only the memory cells of the second group are read, and those memory cells are read using the lower second set of read voltage levels.

By reading the first and second groups of memory cells using different read voltages, the FBCs are reduced as compared to only using a single set of read voltages to read all of the memory cells of the selected word line. In the first embodiment, the same sensing time T_Sense (discussed in further detail below) is employed in both of the first and second parts of the read operation.

Figure 23:
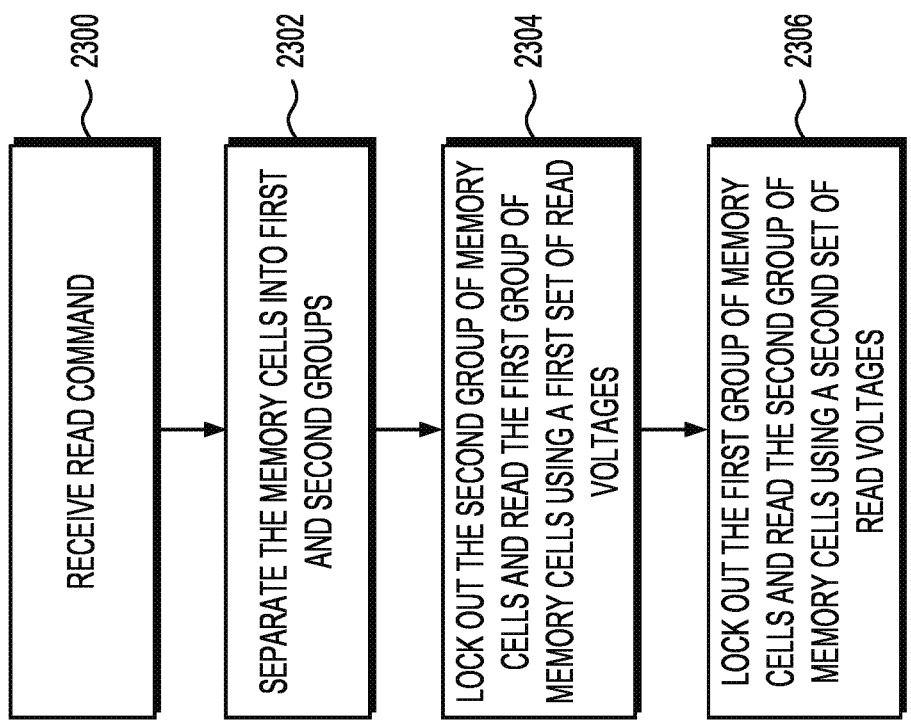
FIG. 23 is a flow chart depicting the steps of reading the memory cells of a selected word line according to a first embodiment.

Turning now to FIG. 23, a flow chart is provided depicting the steps of reading the memory cells of a selected word line according to the first embodiment. At step 2300, a read command is received by control circuitry of the memory device from a source, e.g., the host. At step 2302, the control circuitry separates the memory cells of the selected word line into the first and second groups, with the first group including the memory cells that are close to the voltage driver and the second group including the memory cells that are distant from the voltage driver. At step 2304, the control circuitry locks out the second group of memory cells and reads the first group of memory cells using a first set of read voltages. At step 2306, the control circuitry locks out the first group of memory cells and reads the second group of memory cells using a second set of read voltages that is different than the first set of read voltages. In some embodiments, step 2306 may be performed before step 2304.

According to a second embodiment of the present disclosure, the first and second groups of memory cells are read separately in two parts of a read operation, but only a single set of read voltages is applied to the control gate of the selected word line while reading both groups. As discussed in further detail below, in this embodiment, the memory cells of the first group are read using a first set of sensing times, and the memory cells of the second group are read using a second set of sensing times that is different than the first set of sensing times.

Figure 20B:
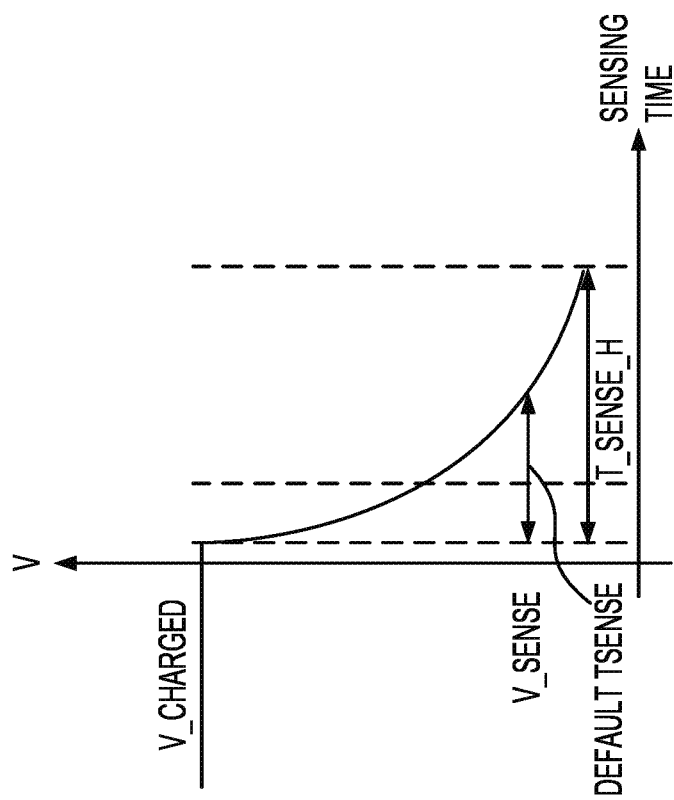
FIG. 20B is a plot illustrating the voltage of a sense node during a sense operation in the first part of the second embodiment of the read operation.
Figure 20A:
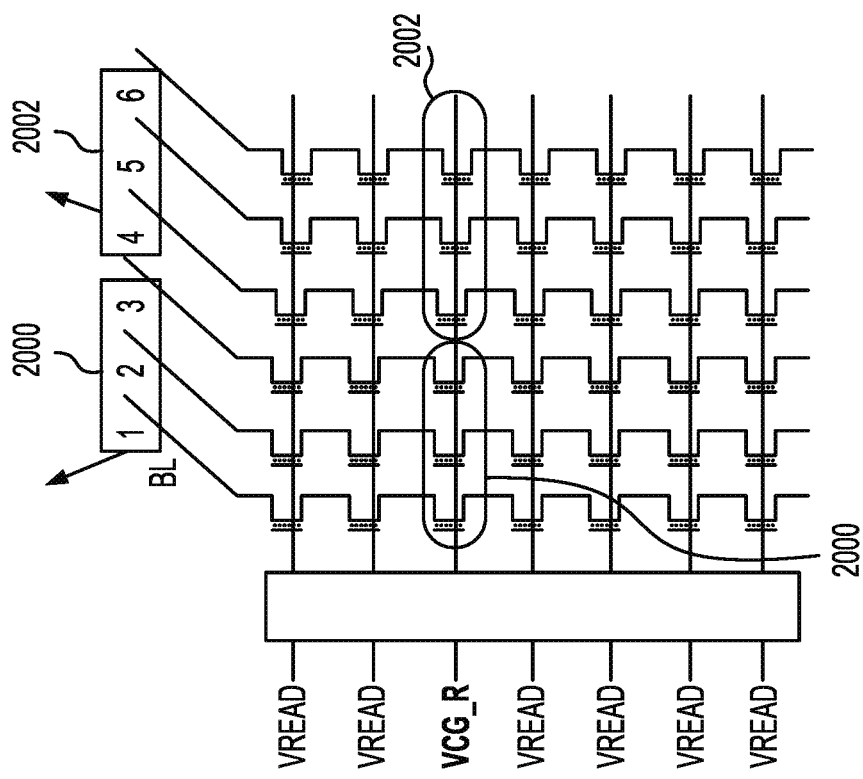
FIG. 20A is a schematic view of a memory device during a first part of a second embodiment of a read operation.
Figure 21B:
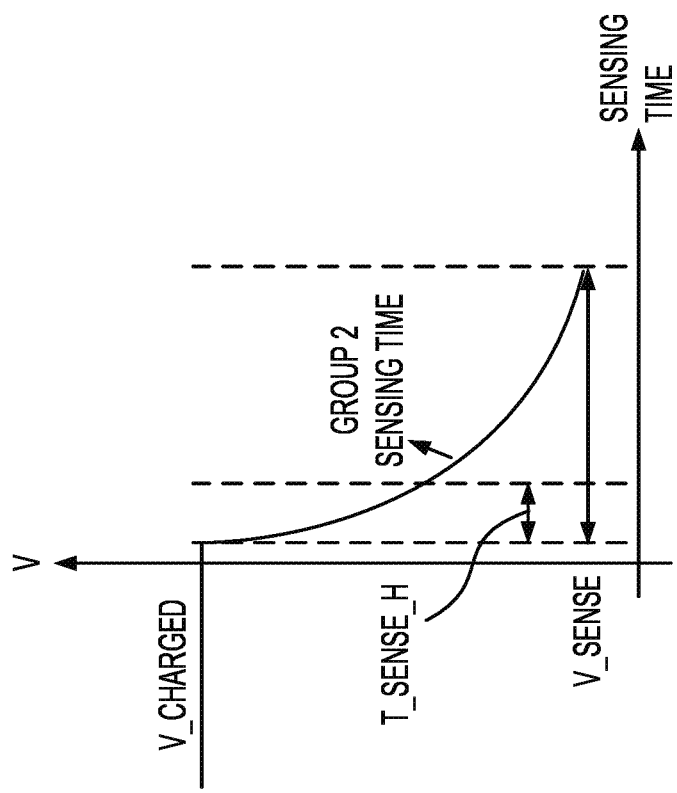
FIG. 21B is a plot illustrating the voltage of a sense node during a sense operation in the second part of the second embodiment of the read operation.
Figure 21A:
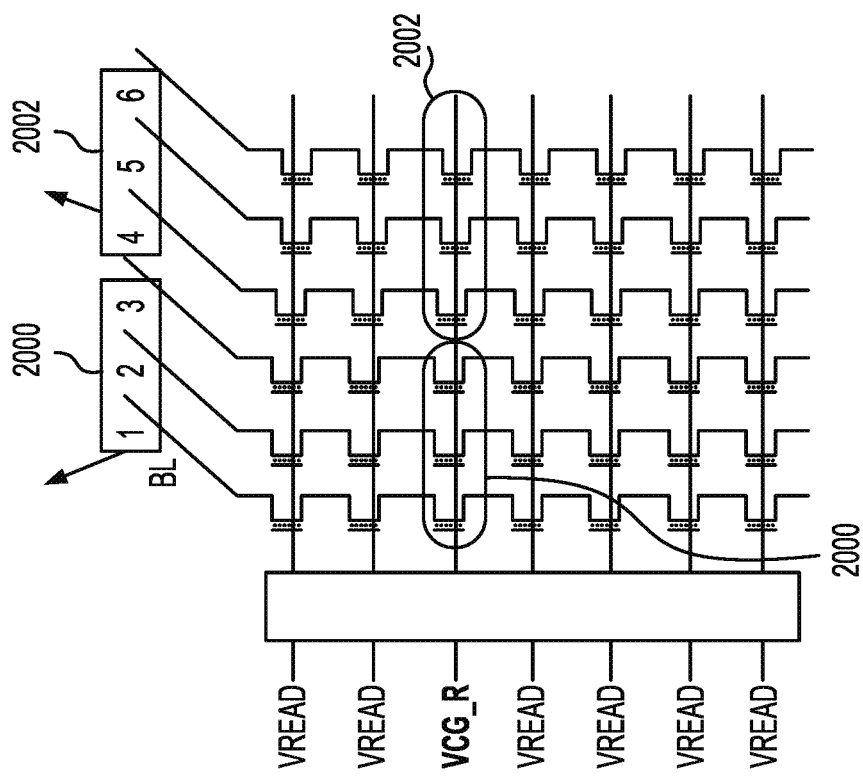
FIG. 21A is a schematic view of a memory device during a second part of a second embodiment of a read operation.

FIGS. 20A and 20B depict the first part of the read operation where the first group 2000 of memory cells are read. During read of the first group 2000, a read voltage VCG_R is applied to the control gate of the selected word line, the high voltage (for example, CELLSRC+0.25 V) is applied to the first group 2000 of bit lines, and the second group 2002 of bit lines are held at zero Volts to lock out the memory cells of the second group 2002.

A sense node is then discharged through one of the bit lines of the first group 2000 from a charged voltage V_Charged to a sensing voltage V Sense while a discharge time from V_Charged to V_Stense is monitored. The discharge time is compared to a sensing time T_Sense_H associated with the one of the data states being sensed (for example, data state S1, S2, or S3). If the discharge time is less than T_Sense_H, then the memory cell being sensed has a threshold voltage Vt that is lower than the data state being sensed. If the discharge time is greater than T_Sense_H, then the memory cell being sensed has a threshold voltage Vt that is higher than the data state being sensed. T_Sense_H is greater than a default sensing time T_Sense associated with the data state being read by a predetermined offset (T_Sense_H=T_Sense+Offset). By increasing the sense time, the threshold voltage Vt that the memory cell being sensed is compared to is increased, e.g., to the level VCG_RH illustrated in FIG. 18. In other words, by offsetting the sense timing, the same result is obtained as was obtained in the first embodiment where the control gate voltage VCG_RH was applied to the control gate of the selected word line. This process is repeated until all of the memory cells of the first group 2000 are read and is then repeated again until read of each of the data states is completed.

Figure 22:
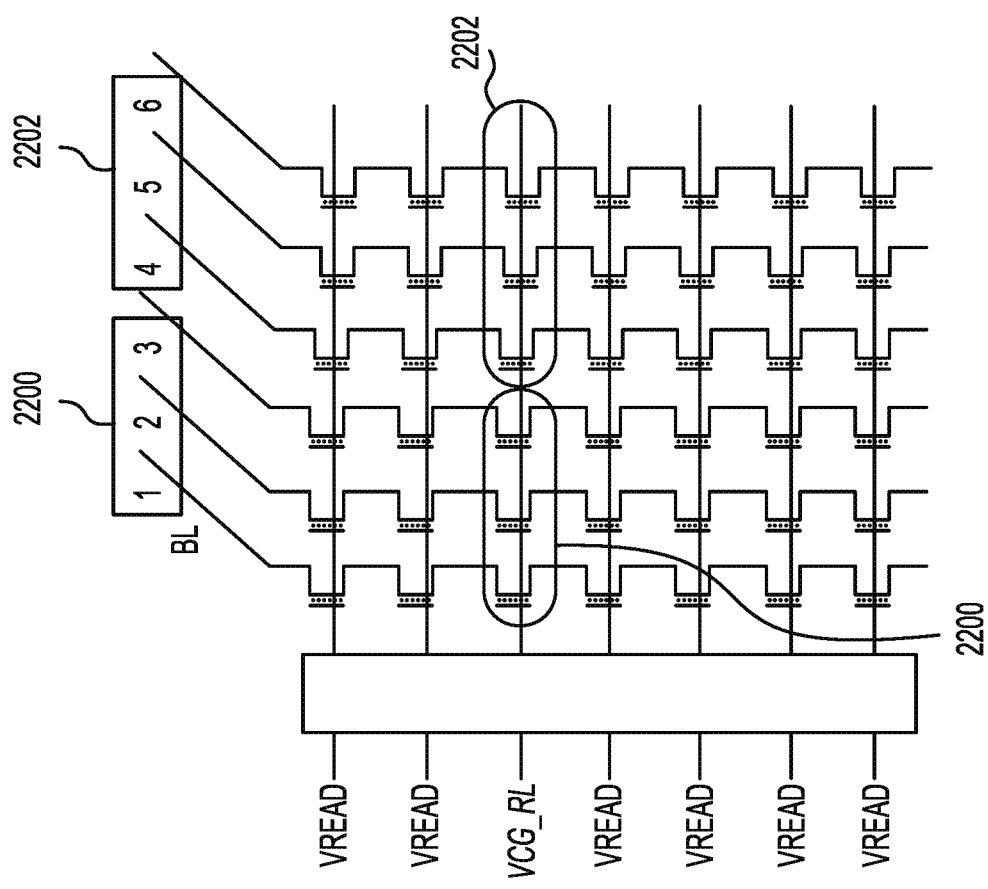
FIG. 22 is a schematic view of a memory device during a third embodiment of a read operation.

FIG. 22 depicts the second part of the read operation where the second group 2102 of memory cells are read. During the read of the second group 2102, the same read voltage VCG_R is applied to the control gate of the selected word line as was applied during the first part of the read operation. The high voltage (for example, CELLSRC+0.25 V) is applied to the second group 2002 of bit lines, and the first group 2000 of bit lines are held at zero Volts to lock out the first group 2000 of memory cells.

The sense node is then discharged through one of the bit lines of the second group 2002, and the discharge time is compared to a sensing time T_Sense_L associated with the one of the data states being sensed (for example, data state S1, S2, or S3). T_Sense_L is less than a default sensing time T_Sense associated with the data state being read by a predetermined offset (T_Sense_L=T_Sense−Offset). By decreasing the sense time, the threshold voltage Vt that the memory cell being sensed is compared to is reduced, e.g., to the level VCG_RL illustrated in FIG. 18. In other words, the same result is obtained as was obtained in the first embodiment where the control gate voltage VCG_RL was applied to the control gate of the selected word line. This process is repeated until all of the memory cells of the second group 2002 are read and is then repeated again until read of each of the data states is completed.

In this embodiment, the benefits of reduced FBC caused by the overlapping of the Vt distributions due to RC delay are realized but at a potentially improved performance as compared to the first embodiment discussed above because the voltages during the read operation do not have to be ramped down and then ramped back up again between the first and second parts of the read operation.

Figure 24:
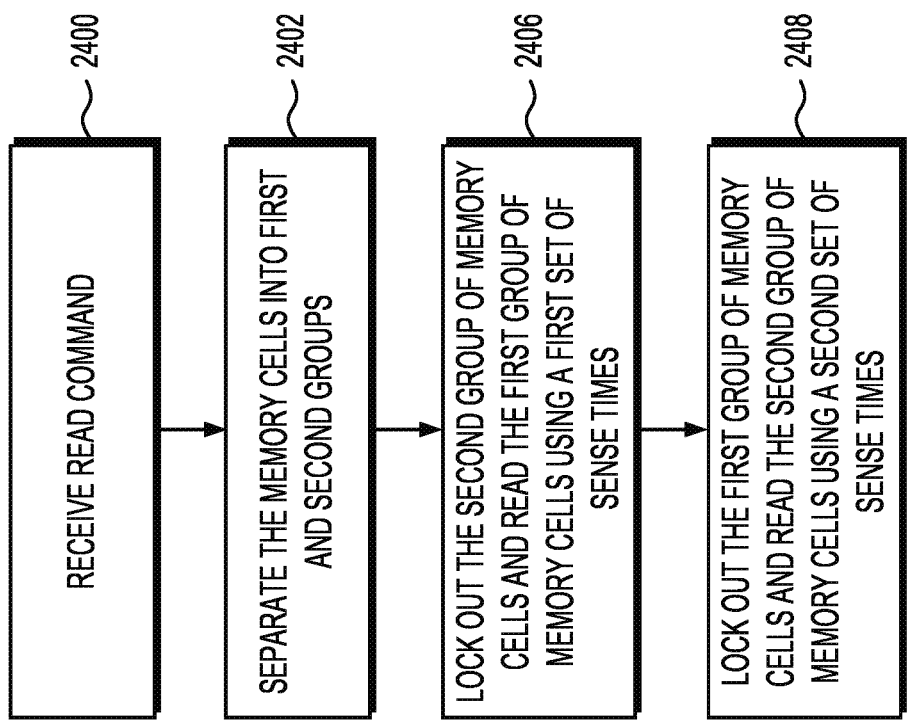
FIG. 24 is a flow chart depicting the steps of reading the memory cells of a selected word line according to a second embodiment.

Turning now to FIG. 24, a flow chart is provided depicting the steps of reading the memory cells of a selected word line according to the second embodiment. At step 2400, a read command is received by control circuitry of the memory device from a source, e.g., the host. At step 2402, the control circuitry separates the memory cells of the selected word line into the first and second groups, with the first group including the memory cells that are close to the voltage driver and the second group including the memory cells that are distant from the voltage driver. At step 2304, the control circuitry locks out the second group of memory cells and reads the first group of memory cells using a first set of sense times. At step 2406, the control circuitry locks out the first group of memory cells and reads the second group of memory cells using a second set of sense times that is different than the first set of sense times. In some embodiments, step 2406 may be performed before step 2404.

Turning now to FIG. 22, a third exemplary embodiment of a read technique to reduce FBC is depicted. In contrast to the first two embodiments discussed above, in this embodiment, the read operation only includes a single part. During this single-part read operation, the same set of read voltages VCG_RL are applied to the control gate of the selected word line. Those read voltages are less than the default read levels identified in FIG. 14 and are consistent with VCG_RL identified in FIG. 18. In other words, the set of read voltages VCG_RL is optimized for reading the second group 2202 of memory cells but is employed to read both the first and second groups 2200, 2202 of memory cells.

In the third embodiment, during the read operation, different non-zero voltages are applied to the first group 2200 of bit lines and to the second group 2202 of bit lines. More specifically, during the read operation, a higher first bit line voltage VBLC H (for example, 0.85 V) is applied to the first group 2200 of bit lines, and a lower second bit line voltage VBLC_L (for example, 0.25 V) is applied to the second group 2202 of bit lines. The higher first voltage applied to the first group 2200 of bit lines induces a drain-side induced barrier layer (DIBL) effect on the memory cells of the first group 2200.

The DIBL effect effectively reduces the threshold voltages Vt of the first group 2200 of memory cells. More specifically, by applying the higher first bit line voltage VBLC H to the first group 2200 of bit lines, the first group 2200 of memory cells have their barriers weakened, thereby allowing more current to flow through the first group 2200 of memory cells as if they had lower threshold voltages Vt themselves. By reducing the effective threshold voltages Vt of the memory cells of the first group 2200 during the read operation the effective threshold voltages Vt of the first group 2200 of memory cells are lowered to be consistent with those of the second group 2202 of memory cells. The lower VCG_RL, which is optimized for reading the second group 2202 of memory cells not the first group 2200 of memory cells, can be used during sensing of both the first and second groups 2200, 2202 of memory cells.

In the third embodiment, the same benefits of reduced FBC caused by the Vt distributions due to RC delay are realized but with improved performance as compared to the first two embodiments discussed above.

Figure 25:
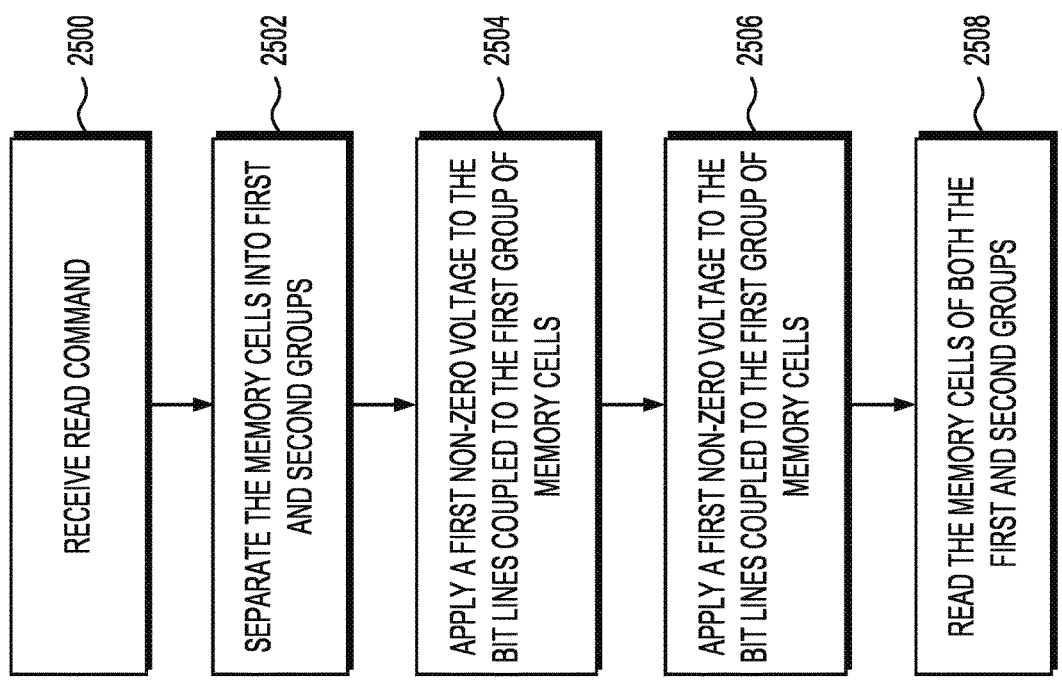
FIG. 25 is a flow chart depicting the steps of reading the memory cells of a selected word line according to a third embodiment.

Turning now to FIG. 25, a flow chart is provided depicting the steps of reading the memory cells of a selected word line according to the third embodiment. At step 2500, a read command is received by control circuitry of the memory device from a source, e.g., the host. At step 2502, the control circuitry separates the memory cells of the selected word line into the first and second groups, with the first group including the memory cells that are close to the voltage driver and the second group including the memory cells that are distant from the voltage driver. At step 2504, the control circuitry applies a first non-zero voltage to the bit lines coupled to the first group of memory cells. At step 2506, the control circuitry applies a second non-zero voltage to the bit lines coupled to the second group of memory cells. At step 2508, the control circuitry reads the memory cells of both the first and second groups in a single-part read operation using only a single set of read voltages.

Various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A method of reading memory cells in a memory device, comprising the steps of:
preparing a memory block that includes a plurality of memory cells arranged in a plurality of word lines, the memory cells being programmed to multiple bits per memory cell, and the memory block including a voltage driver that is located on one side of the word lines;
separating the memory cells of a selected word line of the plurality of word lines into a first group of memory cells that located on a side of the word line are near the voltage driver and a second group of memory cells that are located on an opposite side of the word line from the voltage driver; and
reading the memory cells of the first group of memory cells using a first read mode and reading the memory cells of the second group using a second read mode that is different than the first read mode to reduce a fail bit count.

2. The method as set forth in claim 1 wherein in the selected word line, the first group of memory cells includes a plurality of first error correction code memory cells and the second group of memory cells includes a plurality of second error correction code memory cells.

3. The method as set forth in claim 2 wherein half of the memory cells of the selected word line are in the first group of memory cells and wherein half of the memory cells of the selected word line are in the second group of memory cells.

4. The method as set forth in claim 3 wherein the first read mode includes locking out the memory cells of the second group while the memory cells of the first group are read and wherein the second read mode includes locking out the memory cells of the first group while the memory cells of the second group are read.

5. The method as set forth in claim 4 wherein the first read mode includes applying a first set of read voltages to the selected word line, the second read mode includes applying a second set of read voltages to the selected word line, the second set of read voltages is different than the first set of read voltages.

6. The method as set forth in claim 5 wherein the second set of read voltages are less than the first set of read voltages.

7. The method as set forth in claim 4 wherein the first read mode includes sensing the memory cells of the first group using a first set of sense times and wherein the second read mode includes sensing the memory cells of the second group using a second set of sense times that is different than the first set of sense times.

8. The method as set forth in claim 3 wherein the first read mode includes applying first non-zero bit line voltage to the bit lines coupled to the memory cells of the first group and wherein the second read mode includes applying a second non-zero bit line voltage to the bit lines coupled to the memory cells of the second group, the first non-zero bit line voltage being greater than the second non-zero bit line voltage such that effective threshold voltages of the memory cells of the first group are reduced through a drain-side induced barrier layer effect.

9. The method as set forth in claim 1 wherein the memory cells of the selected word line are programmed to two bits per memory cell (MLC) in a programming operation that does not include verify.

10. A memory device, comprising:
a memory block that includes a plurality of memory cells arranged in a plurality of word lines, the memory cells being programmed to multiple bits per memory cell, and the memory block including a voltage driver that is located on one side of the word lines;
control circuitry that is configured to read the memory cells of a selected word line of the plurality of word lines, the control circuitry being configured to:
separate the memory cells of the selected word line into a first group of memory cells that are located on a side of the word line are near the voltage driver and a second group of memory cells that are located on an opposite side of the word line from the voltage driver, and
read the memory cells of the first group of memory cells using a first read mode and read the memory cells of the second group using a second read mode that is different than the first read mode to reduce a fail bit count.

11. The memory device as set forth in claim 10 wherein in the selected word line, the first group of memory cells includes a plurality of first error correction code memory cells and the second group of memory cells includes a plurality of second error correction code memory cells.

12. The memory device as set forth in claim 11 wherein half of the memory cells of the selected word line are in the first group of memory cells and wherein half of the memory cells of the selected word line are in the second group of memory cells.

13. The memory device as set forth in claim 12 wherein the first read mode includes the control circuitry locking out the memory cells of the second group while the memory cells of the first group are read and wherein the second read mode includes the control circuitry locking out the memory cells of the first group while the memory cells of the second group are read.

14. The memory device as set forth in claim 13 wherein the first read mode includes the control circuitry applying a first set of read voltages to the selected word line, the second read mode includes the control circuitry applying a second set of read voltages to the selected word line, the second set of read voltages is different than the first set of read voltages.

15. The memory device as set forth in claim 14 wherein the second set of read voltages are less than the first set of read voltages.

16. The memory device as set forth in claim 13 wherein the first read mode includes the control circuitry sensing the memory cells of the first group using a first set of sense times and wherein the second read mode includes the control circuitry sensing the memory cells of the second group using a second set of sense times that is different than the first set of sense times.

17. The memory device as set forth in claim 12 wherein the first read mode includes the control circuitry applying first non-zero bit line voltage to the bit lines coupled to the memory cells of the first group and wherein the second read mode includes the control circuitry applying a second non-zero bit line voltage to the bit lines coupled to the memory cells of the second group, the first non-zero bit line voltage being greater than the second non-zero bit line voltage such that effective threshold voltages of the memory cells of the first group are reduced through a drain-side induced barrier layer effect.

18. The memory device as set forth in claim 10 wherein the memory cells of the selected word line are programmed to two bits per memory cell (MLC) in a programming operation that does not include verify.

19. An apparatus, comprising:
a memory block that includes a plurality of memory cells arranged in a plurality of word lines, the memory cells being programmed to multiple bits per memory cell, and the memory block including a voltage driver that is located on one side of the word lines;
a reading means for reading the memory cells of a selected word line of the plurality of word lines, the reading means being configured to:
separate the memory cells of the selected word line into a first group of memory cells and a second group of memory cells, the first group of memory cells including half the memory cells of the selected word line that are located on a side of the word line adjacent the voltage driver, and the second group of memory cells include half of the memory cells of the selected word line that are located on an opposite side of the word line from the voltage driver, and
read the memory cells of the first group of memory cells using a first read mode and read the memory cells of the second group using a second read mode that is different than the first read mode to reduce a fail bit count.

20. The apparatus as set forth in claim 19 wherein in the first read mode, the reading means locks out the memory cells of the second group, and wherein in the second read mode, the reading means locks out the memory cells of the first group.

* * * * *